(12) United States Patent
Yeh et al.

(10) Patent No.: US 11,332,363 B2
(45) Date of Patent: May 17, 2022

(54) STACKED STRUCTURE AND METHOD FOR MANUFACTURING THE SAME

(71) Applicant: Advanced Semiconductor Engineering, Inc., Kaohsiung (TW)

(72) Inventors: Chieh-An Yeh, Kaohsiung (TW); Tai-Hung Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 54 days.

(21) Appl. No.: 16/670,493

(22) Filed: Oct. 31, 2019

(65) Prior Publication Data

US 2021/0130166 A1    May 6, 2021

(51) Int. Cl.
*B81B 7/00* (2006.01)
*B81C 1/00* (2006.01)

(52) U.S. Cl.
CPC .......... *B81B 7/0064* (2013.01); *B81C 1/0038* (2013.01); *B81C 1/00047* (2013.01); *B81C 1/00333* (2013.01); *B81C 1/00492* (2013.01); *B81B 2203/0315* (2013.01); *B81C 2201/019* (2013.01)

(58) Field of Classification Search
CPC .................................................... B81B 7/0064
See application file for complete search history.

(56) References Cited

U.S. PATENT DOCUMENTS

| 10,050,000 | B2* | 8/2018 | Huang | H01L 23/49816 |
| 2008/0087650 | A1* | 4/2008 | Wang | B23K 11/34 |
| | | | | 219/117.1 |
| 2012/0229709 | A1* | 9/2012 | Heald | B81C 1/00269 |
| | | | | 348/739 |
| 2014/0202628 | A1* | 7/2014 | Sreetharan | B32B 37/0076 |
| | | | | 156/257 |
| 2016/0347609 | A1* | 12/2016 | Yu | B81B 7/0006 |
| 2018/0220216 | A1* | 8/2018 | Agashe | B81B 3/0089 |
| 2019/0006455 | A1* | 1/2019 | Ku | H01L 24/13 |
| 2019/0148566 | A1* | 5/2019 | Kalz | H01L 31/0203 |
| | | | | 257/414 |
| 2019/0268679 | A1* | 8/2019 | Kurihara | H04R 1/086 |
| 2020/0105668 | A1* | 4/2020 | Ho | H01L 21/7685 |

* cited by examiner

*Primary Examiner* — Moazzam Hossain
(74) *Attorney, Agent, or Firm* — Foley & Lardner LLP

(57) ABSTRACT

A stacked structure includes a polymer layer and a metal layer. The metal layer is disposed on the polymer layer. A burr length on a surface of the polymer layer is about 0.8 μm to about 150 μm, and a burr length on a surface of the metal layer is about 0.8 μm to about 7 μm.

18 Claims, 27 Drawing Sheets

STACKED STRUCTURE AND METHOD FOR MANUFACTURING THE SAME

BACKGROUND

1. Field of the Disclosure

The present disclosure relates to a stacked structure and a method, and to a stacked structure with reduced burrs, and a method for manufacturing the stacked structure.

2. Description of the Related Art

Microelectromechanical system (MEMS) technique is used in portable communication devices, especially in smart phones. The MEMS package structure may provide basic protection function for electronic structures. Besides, in order to improve the signal-to-noise ratio performance, the MEMS package structure is further specified to provide shielding function to environmental electromagnetic interference. Furthermore, when the MEMS package structure is used in smart phones, it should provide filtering function to radio frequency (RF) bands.

SUMMARY

In some embodiments, a stacked structure includes a polymer layer and a metal layer. The metal layer is disposed on the polymer layer. A burr length on a surface of the polymer layer is about 0.8 μm to about 150 μm, and a burr length on a surface of the metal layer is about 0.8 μm to about 7 μm.

In some embodiments, a stacked structure includes a polymer layer and a metal layer. The metal layer is disposed on the polymer layer. A lateral surface of the stacked structure defines an indentation structure.

In some embodiments, a method for forming a stacked structure includes (a) providing a multi-layered structure comprising a polymer layer and a metal layer disposed on the polymer layer; and (b) cutting through the multi-layered structure by using a V-shaped blade and a standard blade.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
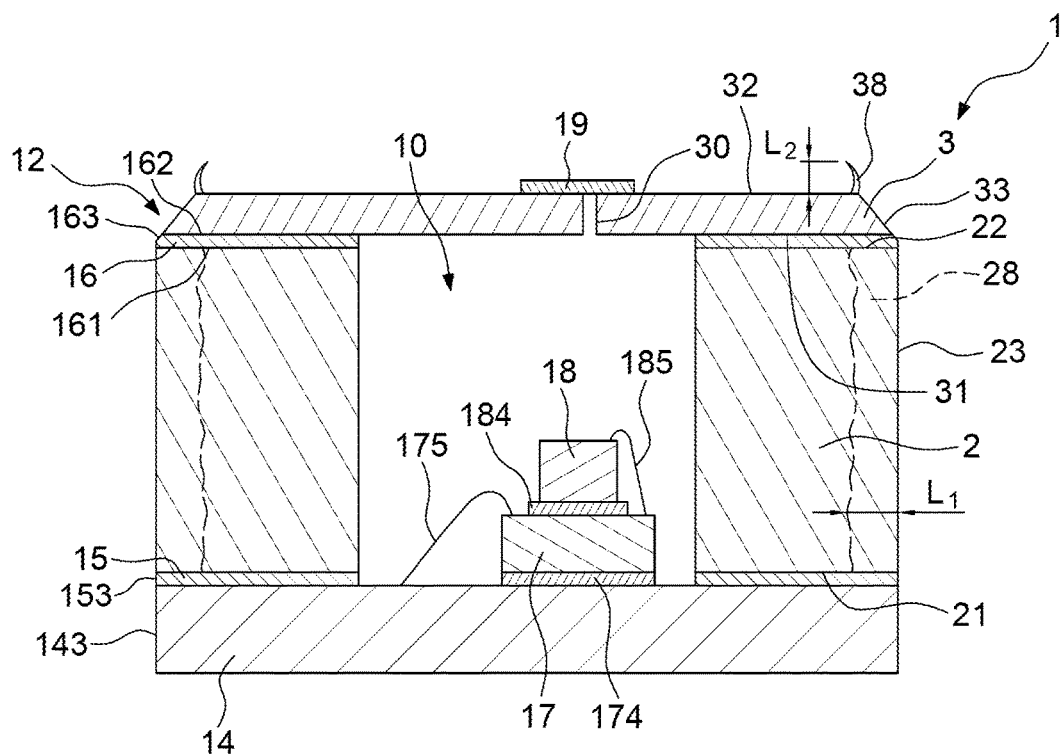
FIG. 1 illustrates a cross-sectional view of an example of a stacked structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A MEMS package structure may include a MEMS chip and an application-specific integrated circuit (ASIC) chip attached to a printed circuit board (PCB). The PCB may include embedded capacitor to provide filtering function to RF bands. The MEMS chip and the ASIC chip may be connected to each other by wires for signal conversion, amplification and output functions. A metal cap may be disposed on the PCB as a conductive housing to cover and protect the MEMS chip and the ASIC chip, and to provide electromagnetic shielding function for the MEMS package structure. However, it is time-consuming to dispose the metal cap corresponding to the MEMS chip and the ASIC chip, thus is not efficient for mass production.

In a comparative embodiment, instead of the metal cap, a wall is formed to surround the MEMS chip and the ASIC chip, and a metal lid is disposed on the wall for electromagnetic shielding function. The wall and the metal lid may provide similar functions as the metal cap. The wall may include an epoxy layer, a liquid crystal polymer (LCP) layer, and another epoxy layer sequentially disposed on the PCB. The metal lid may include a stainless steel (SUS) layer. After forming the wall and disposing the lid, a singulation process may be conducted to cut through the wall and the lid.

However, it is difficulty to cut the composite of the LCP layer and the SUS layer at once because the material properties of the LCP layer and the SUS layer are very different from each other. Due to the high toughness of LCP and/or SUS, burrs may easily occur on the LCP layer and/or the SUS layer. For example, a burr length of the LCP layer may be greater than 250 μm, and a burr length of the SUS layer may be greater than 25 μm. The long or large burrs of the LCP layer may enlarge the total volume of the MEMS package structure, so that the MEMS package structure may have a larger footprint. Further, the long or large burrs of the SUS layer may further result in a short circuit when it contacts an adjacent device. In addition, during a pick-and-place process, a suction head may be used to suck the MEMS package structure, and the long or large burrs may be attached to the suction head. Thus, when the suction head sucks next package structure, the burrs may scratch and damage the next package structure.

The present disclosure addresses at least some of the above concerns and provides for a stacked structure with reduced burrs. Some embodiments of the present disclosure further provides for a method for manufacturing the stacked structure.

FIG. 1 illustrates a cross-sectional view of an example of a stacked structure 1 according to some embodiments of the present disclosure. The stacked structure 1 may include a substrate 14, at least one semiconductor chip (e.g., an application-specific integrated circuit (ASIC) chip 17 and a microelectromechanical system (MEMS) chip 18), a first adhesive layer 15, a polymer layer 2, a second adhesive layer 16, a metal layer 3 and an air-permeable film 19. In some embodiments, the stacked structure 1 may be a MEMS package structure.

The substrate 14 may be a substrate of various types and materials, which are not limited in the present disclosure. In some embodiments, the substrate may be a printed circuit board (PCB). The at least one semiconductor chip (e.g., the ASIC chip 17 and the MEMS chip 18) is electrically connected to the substrate 14. The ASIC chip 17 is disposed on the substrate 14. For example, the ASIC chip 17 may be attached to the substrate 14 through an adhesive 174, and may be electrically connected to the substrate 14 through a wire 175. The MEMS chip 18 is disposed on the ASIC chip 17. For example, the MEMS chip 18 may be attached to the ASIC chip 17 through an adhesive 184, and may be electrically connected to the ASIC chip 17 through a wire 185.

The first adhesive layer 15, the polymer layer 2 and the second adhesive layer 16 are sequentially disposed on the substrate 14 and surround the ASIC chip 17 and the MEMS chip 18. The first adhesive layer 15, the polymer layer 2 and the second adhesive layer 16 jointly define a cavity 10. The semiconductor chip (e.g., the ASIC chip 17 and the MEMS chip 18) is accommodated in the cavity 10.

As shown in FIG. 1, the first adhesive layer 15 is disposed on the substrate 14. The first adhesive layer 15 may include a lateral surface 153 substantially perpendicular to a lateral surface 143 of the substrate 14. The first adhesive layer 15 may be made of an adhesive material, such as epoxy. In some embodiments, a thickness of the first adhesive layer 15 may be about 20 μm.

The polymer layer 2 is disposed on the first adhesive layer 15, and is attached to the substrate 14 through the first adhesive layer 15. The polymer layer 2 has a first surface 21, a second surface 22 opposite to the first surface 21, and a lateral surface 23 extending between the first surface 21 and the second surface 22. The first surface 21 is disposed on and contacts the first adhesive layer 15. The lateral surface 23 may be substantially coplanar with the lateral surface 153 of the first adhesive layer 15 and/or the lateral surface 143 of the substrate 14. The polymer layer 2 may include, or may be made of, liquid crystal polymer. In some embodiments, a thickness of the polymer layer 2 may be about 400 µm to about 800 µm, such as about 500 µm to about 700 µm, or about 650 µm.

The second adhesive layer 16 is disposed on the polymer layer 2. The second adhesive layer 16 has a first surface 161, a second surface 162 opposite to the first surface 161, and a lateral surface 163 extending between the first surface 161 and the second surface 162. The first surface 161 is disposed on and contacts the second surface 22 of the polymer layer 2. The lateral surface 163 may include a portion substantially coplanar with the lateral surface 23 of the polymer layer 2. The second adhesive layer 16 may be made of an adhesive material, such as epoxy. In some embodiments, a thickness of the second adhesive layer 16 may also be about 20 µm.

The metal layer 3 is disposed on the polymer layer 2. For example, the metal layer 3 is attached to the polymer layer 2 through the second adhesive layer 16. That is, the second adhesive layer 16 bonds the polymer layer 2 and the metal layer 3 together. The metal layer 3 covers the cavity 10 to protect the ASIC chip 17 and the MEMS chip 18. The metal layer 3 has a first surface 31, a second surface 32 opposite to the first surface 31, and a lateral surface 33 extending between the first surface 31 and the second surface 32. In some embodiments, as shown in FIG. 1, the lateral surface 33 is slanted toward the polymer layer 2. The metal layer 3 tapers upward. The metal layer 3 defines a through hole 30 extending through the metal layer 3. The through hole 30 communicates with the cavity 10. The metal layer 3 may include, or may be made of, steel, such as stainless steel. In some embodiments, a thickness of the metal layer 3 may be about 30 µm to about 100 µm, such as about 40 µm to about 80 µm, or about 60 µm.

The lateral surface 163 of the second adhesive layer 16 may further include a portion substantially coplanar with the lateral surface 33 of the metal layer 3. However, in other embodiments, the entire lateral surface 163 of the second adhesive layer 16 may be substantially coplanar with the lateral surface 23 of the polymer layer 2, or may be substantially coplanar with the lateral surface 33 of the metal layer 3.

The air-permeable film 19 is disposed on the metal layer 3 and covers the through hole 30 of the metal layer 3. The air-permeable film 19 may include porous polytetrafluoroethene (PTFE). In some embodiments, the air-permeable film 19 may be omitted.

The stacked structure 1 has a lateral surface. For example, the lateral surface of the stacked structure 1 may include the lateral surface 143 of the substrate 14, the lateral surface 153 of the first adhesive layer 15, the lateral surface 23 of the polymer layer 2, the lateral surface 163 of the second adhesive layer 16, and the lateral surface 33 of the metal layer 3. The lateral surface of the stacked structure 1 defines an indentation structure 12. As shown in FIG. 1, the indentation structure 12 is mainly defined by the lateral surface 33 of the metal layer 3. For example, the lateral surface 33 of the metal layer 3 is slanted toward the polymer layer 2 to define the indentation structure 12. The indentation structure 12 is located at the upper corners of the stacked structure 1, and tapers downward. That is, a width of an upper portion of the indentation structure 12 is greater than a width of a lower portion of the indentation structure 12.

Due to the cutting process for forming the stacked structure 1, burrs may occur on the polymer layer 2 and/or the metal layer 3. In a comparative example, burr length on a polymer layer may be greater than 25 µm, and burr length on a metal layer may be greater than 250 µm. In the present disclosure, an improved cutting method, such as the method shown in FIGS. 5 through 22 is utilized for forming the stacked structure 1. Such a cutting method may sufficiently reduce the burr length on the polymer layer 2 and/or the metal layer 3, and may simultaneously result in the indentation structure 12 of the stacked structure 1.

For example, the polymer layer 2 may have at least one burr formed on the lateral surface 23, such as a burr 28 as shown in FIG. 1. A burr length $L_1$ of the burr 28 on the lateral surface 23 of the polymer layer 2 is about 0.8 µm to about 150 µm. The burr length $L_1$ may be measured from the lateral surface 23 (e.g., from an average level or a predetermined level thereof) along a direction perpendicular to the lateral surface 23.

The metal layer 3 may also have at least one burr formed on the top surface (e.g., the second surface 32) and/or the lateral surface 33, such as a burr 38 as shown in FIG. 1. A burr length $L_2$ of the burr 38 on the second surface 32 and/or the lateral surface 33 of the metal layer 3 is about 0.8 µm to about 7 µm. The burr length $L_2$ may be measured from the second surface 32 and/or the lateral surface 33 (e.g., from an average level or a predetermined level thereof) along a direction perpendicular to the second surface 32 and/or the lateral surface 33.

Since the burr length on the polymer layer 2 and/or the metal layer 3 is sufficiently reduced, the stacked structure 1 may have a smaller footprint. Further, the short or small burrs of the metal layer 3 may not contact an adjacent device readily; thus, the risk of forming a short circuit is reduced. In addition, during a pick-and-place process, the short or small burrs may not be attached to the suction head readily.

Figure 2:
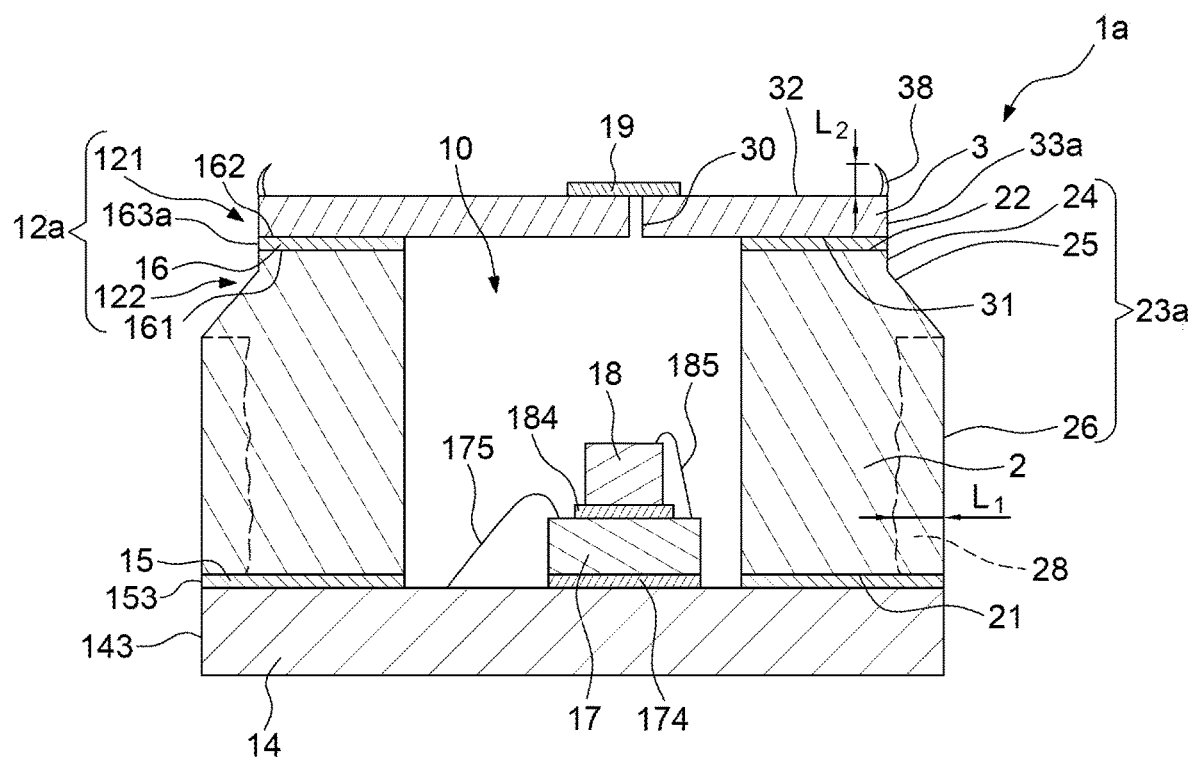
FIG. 2 illustrates a cross-sectional view of an example of a stacked structure according to some embodiments of the present disclosure.

FIG. 2 illustrates a cross-sectional view of a stacked structure 1a according to some embodiments of the present disclosure. The stacked structure 1a is similar to the stacked structure 1 shown in FIG. 1, except for the follows.

As shown in FIG. 2, the stacked structure 1a has a lateral surface defining an indentation structure 12a. The lateral surface of the stacked structure 1a may also include the lateral surface 143 of the substrate 14, the lateral surface 153 of the first adhesive layer 15, the lateral surface 23a of the polymer layer 2, the lateral surface 163a of the second adhesive layer 16, and the lateral surface 33a of the metal layer 3. However, the lateral surface 33a of the metal layer 3 is not slanted. Instead, the lateral surface 23a of the polymer 2 has a slanted portion 25 defining the indentation structure 12a.

As shown in FIG. 2, the lateral surface 33a of the metal layer 3 is substantially perpendicular to the first surface 31 and/or the second surface 32 of the metal layer 3. The metal layer 3 has a substantially consistent width. The entire lateral surface 163a of the second adhesive layer 16 is substantially coplanar with the lateral surface 33a of the metal layer 3.

The lateral surface 23a of the polymer layer 2 has a first portion 24, the slanted portion 25 and a second portion 26. Each of the first portion 24, the slanted portion 25 and the second portion 26 are not coplanar to the others. The first portion 24 is substantially coplanar with the lateral surface 33a of the metal layer 3 and/or the lateral surface 163a of the second adhesive layer 16. The second portion 26 is substantially coplanar with the lateral surface 143 of the substrate 14 and/or the lateral surface 153 of the first adhesive layer 15. The slanted portion 25 extends between the first portion 24 and the second portion 26, and connects the first portion 24 and the second portion 26. A portion of the polymer layer 2 (e.g., corresponding to the slanted portion 25 of the lateral surface 23a of the polymer layer 2) tapers upward.

In some embodiments, the indentation structure 12a extends into the polymer layer 2. In other words, the indentation structure 12a includes a first portion 121 and a second portion 122. The first portion 121 of the indentation structure 12a corresponds to the metal layer 3, the second adhesive layer 16 and the first portion 24 of the polymer layer 2, and has a substantially consistent width. The second portion 122 of the indentation structure 12a corresponds to the slanted portion 25 of the polymer layer 2 and tapers downward.

In the present disclosure, an improved cutting method, such as the method shown in FIGS. 23 through 32 is utilized for forming the stacked structure 1a. Such a cutting method may sufficiently reduce the burr length on the polymer layer 2 and/or the metal layer 3, and may simultaneously result in the indentation structure 12a of the stacked structure 1a. For example, a burr length $L_1$ of the burr 28 on the lateral surface 23a (e.g., the second portion 26) of the polymer layer 2 is about 0.8 μm to about 150 μm, and a burr length $L_2$ of the burr 38 on the second surface 32 and/or the lateral surface 33a of the metal layer 3 is about 0.8 μm to about 7 μm.

Figure 3:
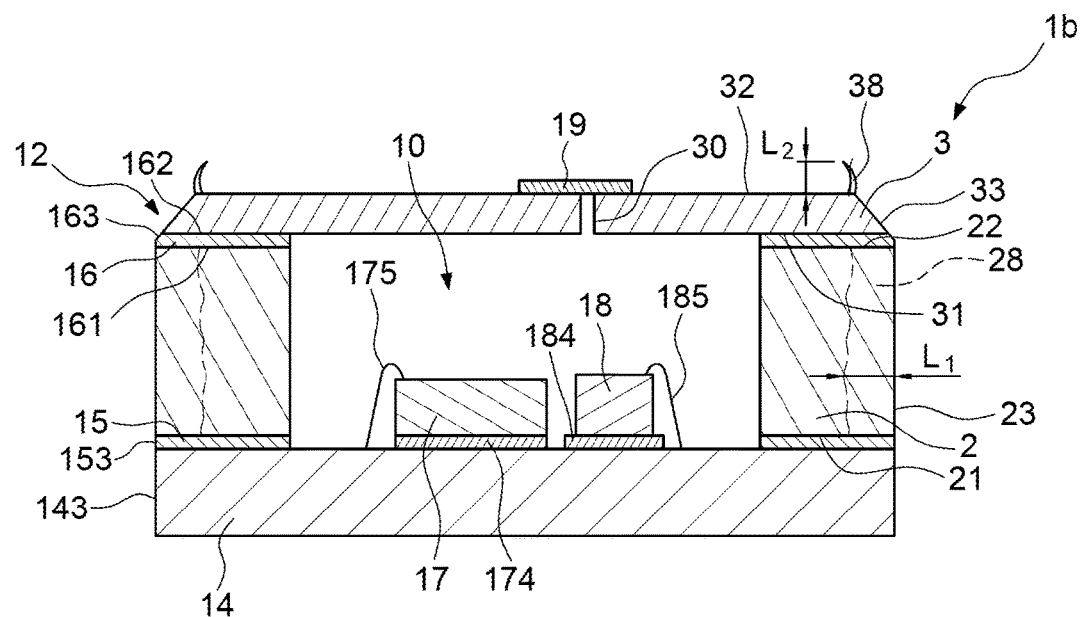
FIG. 3 illustrates a cross-sectional view of an example of a stacked structure according to some embodiments of the present disclosure.

FIG. 3 illustrates a cross-sectional view of a stacked structure 1b according to some embodiments of the present disclosure. The stacked structure 1b is similar to the stacked structure 1 shown in FIG. 1, except for the arrangement of the MEMS chip 18.

As shown in FIG. 3, the MEMS chip 18 is not disposed on the ASIC chip 17. Instead, the MEMS chip 18 is disposed on the substrate 14. For example, the MEMS chip 18 may be attached to the substrate 14 through an adhesive 184, and may be electrically connected to the substrate 14 through a wire 185.

Figure 4:
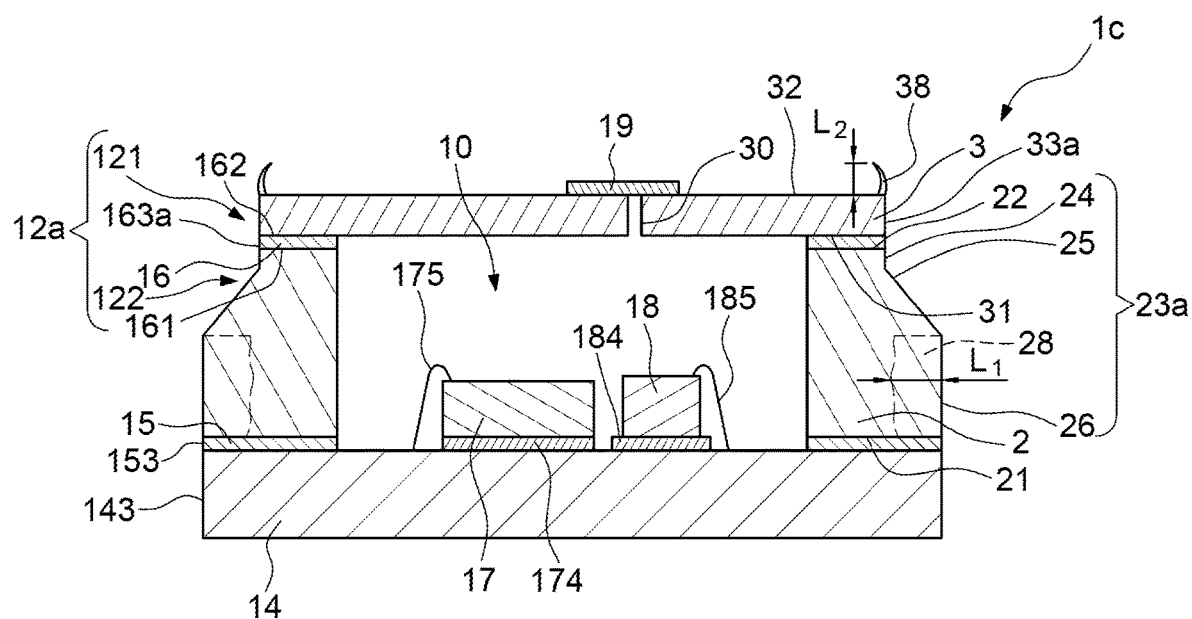
FIG. 4 illustrates a cross-sectional view of an example of a stacked structure according to some embodiments of the present disclosure.

FIG. 4 illustrates a cross-sectional view of a stacked structure 1c according to some embodiments of the present disclosure. The stacked structure 1c is similar to the stacked structure 1a shown in FIG. 2, except for the arrangement of the MEMS chip 18.

As shown in FIG. 4, the MEMS chip 18 is not disposed on the ASIC chip 17. Instead, the MEMS chip 18 is disposed on the substrate 14. For example, the MEMS chip 18 may be attached to the substrate 14 through an adhesive 184, and may be electrically connected to the substrate 14 through a wire 185.

FIG. 5 through FIG. 22 illustrate a method for manufacturing a stacked structure according to some embodiments of the present disclosure, such as the stacked structure 1 shown in FIG. 1.

Figure 5:
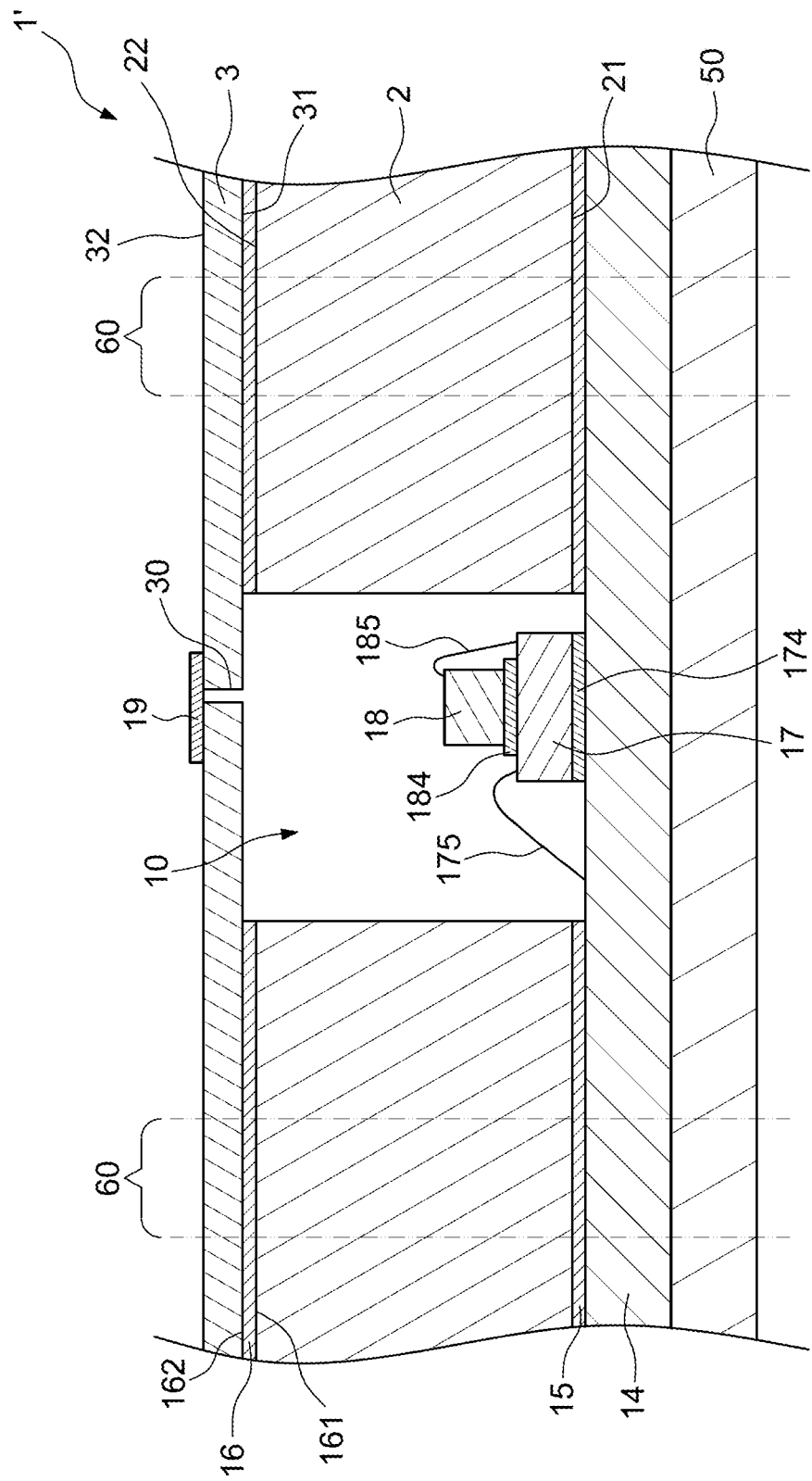
FIG. 5 illustrates one or more stages of an example of a method for manufacturing a stacked structure according to some embodiments of the present disclosure.

Referring to FIG. 5, a multi-layered structure 1' is provided on a carrier 50. The multi-layered structure 1' may include a substrate 14, at least one semiconductor chip (e.g., an application-specific integrated circuit (ASIC) chip 17 and a microelectromechanical system (MEMS) chip 18), a first adhesive layer 15, a polymer layer 2, a second adhesive layer 16, a metal layer 3 and an air-permeable film 19. The multi-layered structure 1' may have a plurality of sawing streets 60.

The substrate 14 may be a substrate of various types and materials, which are not limited in the present disclosure. In some embodiments, the substrate 14 may be a printed circuit board (PCB). The at least one semiconductor chip (e.g., the ASIC chip 17 and the MEMS chip 18) is electrically connected to the substrate 14. The ASIC chip 17 is disposed on the substrate 14. For example, the ASIC chip 17 may be attached to the substrate 14 through an adhesive 174, and may be electrically connected to the substrate 14 through a wire 175. The MEMS chip 18 is disposed on the ASIC chip 17. For example, the MEMS chip 18 may be attached to the ASIC chip 17 through an adhesive 184, and may be electrically connected to the ASIC chip 17 through a wire 185.

The first adhesive layer 15, the polymer layer 2 and the second adhesive layer 16 are sequentially disposed on the substrate 14 and surround the ASIC chip 17 and the MEMS chip 18. The first adhesive layer 15, the polymer layer 2 and the second adhesive layer 16 jointly define a cavity 10. The semiconductor chip (e.g., the ASIC chip 17 and the MEMS chip 18) is accommodated in the cavity 10.

The first adhesive layer 15 is disposed on the substrate 14. The polymer layer 2 is disposed on the first adhesive layer 15, and is attached to the substrate 14 through the first adhesive layer 15. The polymer layer 2 has a first surface 21 and a second surface 22 opposite to the first surface 21. The first surface 21 is disposed on and contacts the first adhesive layer 15. The second adhesive layer 16 is disposed on the polymer layer 2. The second adhesive layer 16 has a first surface 161 and a second surface 162 opposite to the first surface 161. The first surface 161 is disposed on and contacts the second surface 22 of the polymer layer 2.

The metal layer 3 is disposed on the polymer layer 2. For example, the metal layer 3 is attached to the polymer layer 2 through the second adhesive layer 16. That is, the second adhesive layer 16 bonds the polymer layer 2 and the metal layer 3 together. The metal layer 3 covers the cavity 10 to protect the ASIC chip 17 and the MEMS chip 18. The metal layer 3 has a first surface 31 and a second surface 32 opposite to the first surface 31, and defines a through hole 30 extending through the metal layer 3. The air-permeable film 19 is disposed on the metal layer 3 and covers the through hole 30 of the metal layer 3. In some embodiments, the air-permeable film 19 may be omitted.

Figure 6:
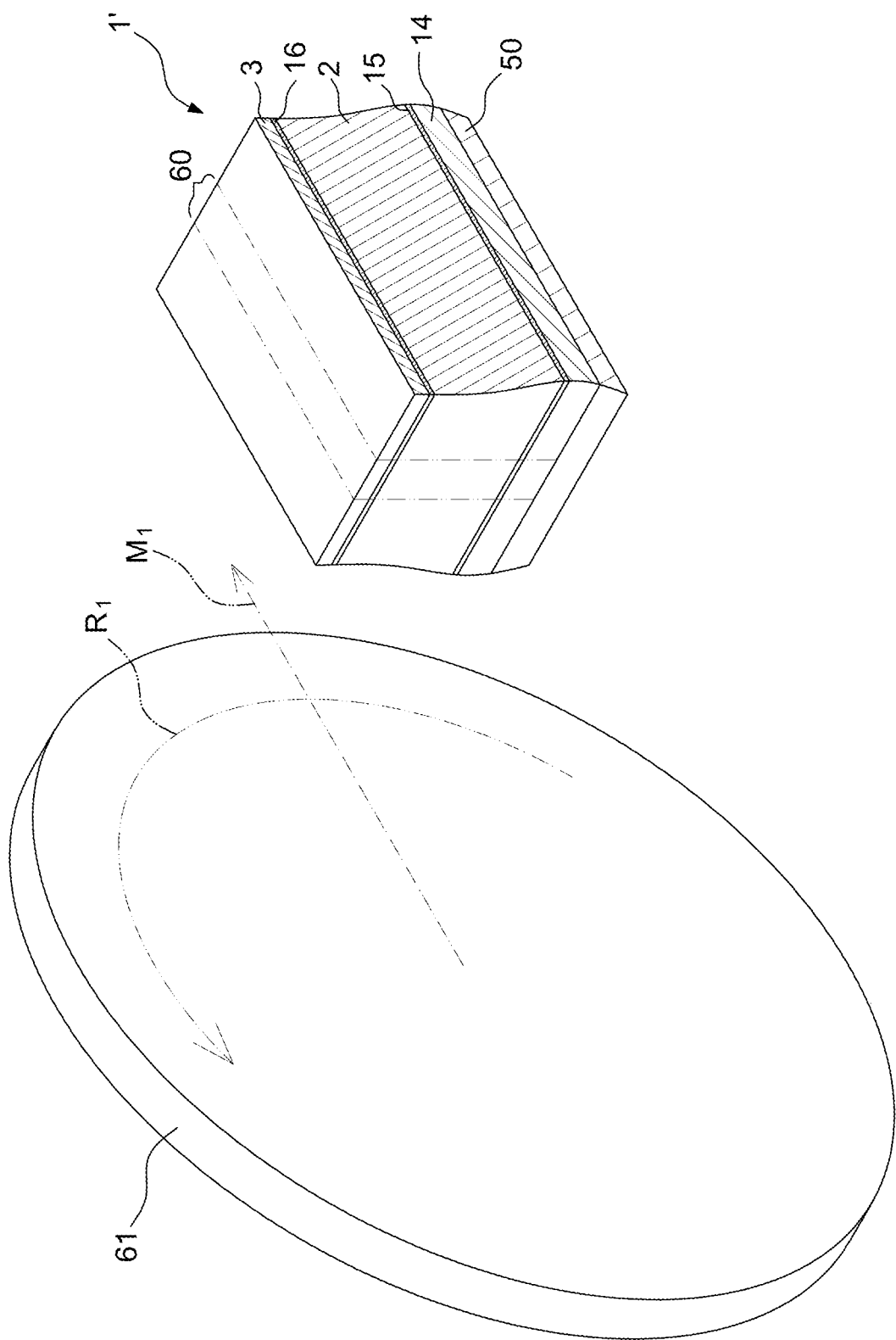
FIG. 6 illustrates one or more stages of an example of a method for manufacturing a stacked structure according to some embodiments of the present disclosure.
Figure 7:
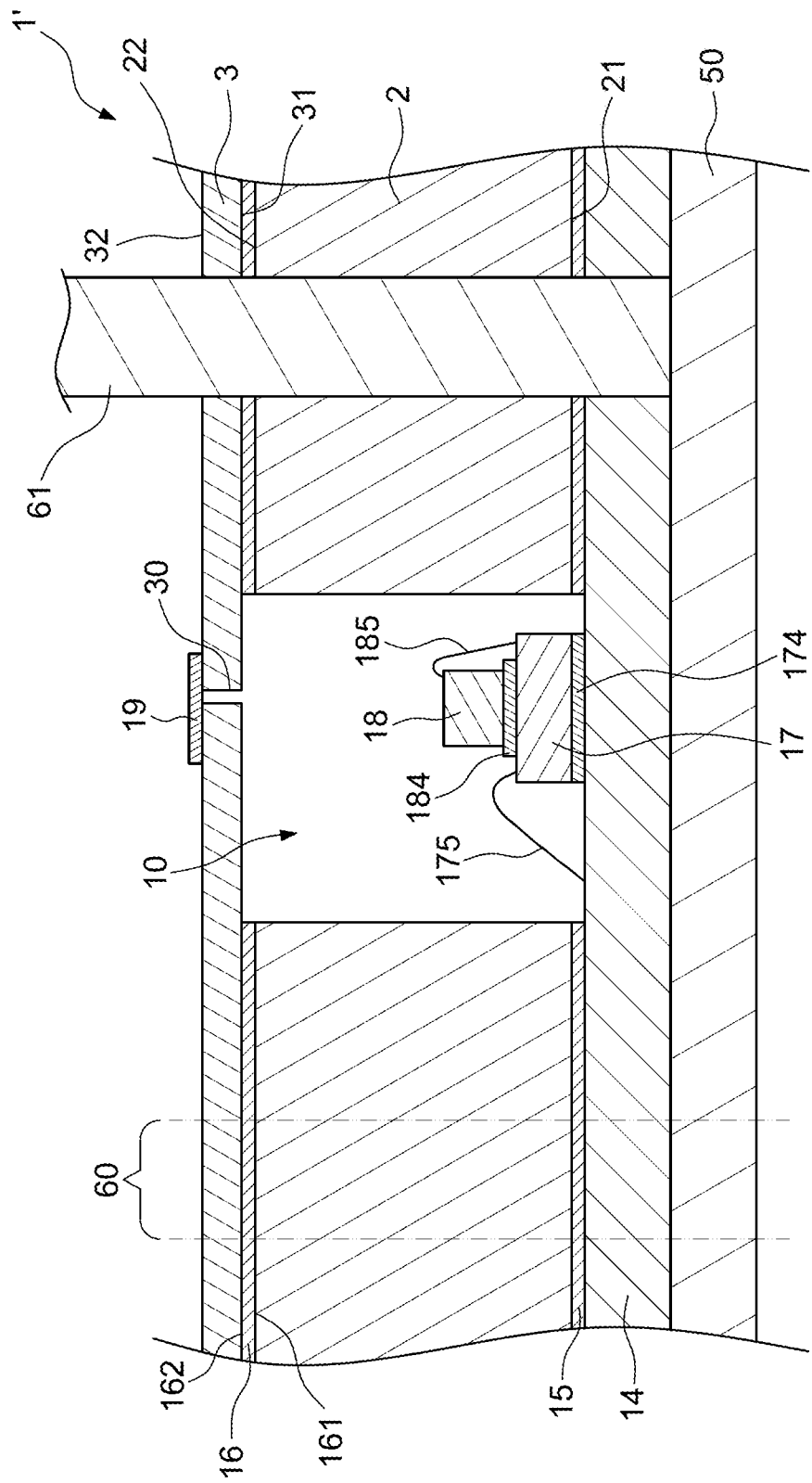
FIG. 7 illustrates one or more stages of an example of a method for manufacturing a stacked structure according to some embodiments of the present disclosure.

Referring to FIGS. 6 and 7, the multi-layered structure 1' is then cut along the sawing streets 60 by using a standard blade 61. The standard blade 61 is fed forward to cut through the multi-layered structure 1'. For example, the standard blade 61 is rotating along a rotation direction $R_1$ while moving along a feed direction $M_1$ toward the multi-layered structure 1'. A tangential velocity of the standard blade 61 at a bottommost point thereof is in a direction parallel to the feed direction $M_1$. The standard blade 61 may be provided with a rotational speed of about 30,000 to about 40,000 rpm, and a feed speed of less than or equal to 10 mm/s, such as less than or equal to 7 mm/s, less than or equal to 5 mm/s or less than or equal to 3 mm/s. The standard blade 61 cuts through the metal layer 3, the second adhesive layer 16, the polymer layer 2, the first adhesive layer 15 and the substrate 14 to reach the carrier 50. In some embodiments, the standard blade 61 may also cut a portion of the carrier 50.

Figure 8:
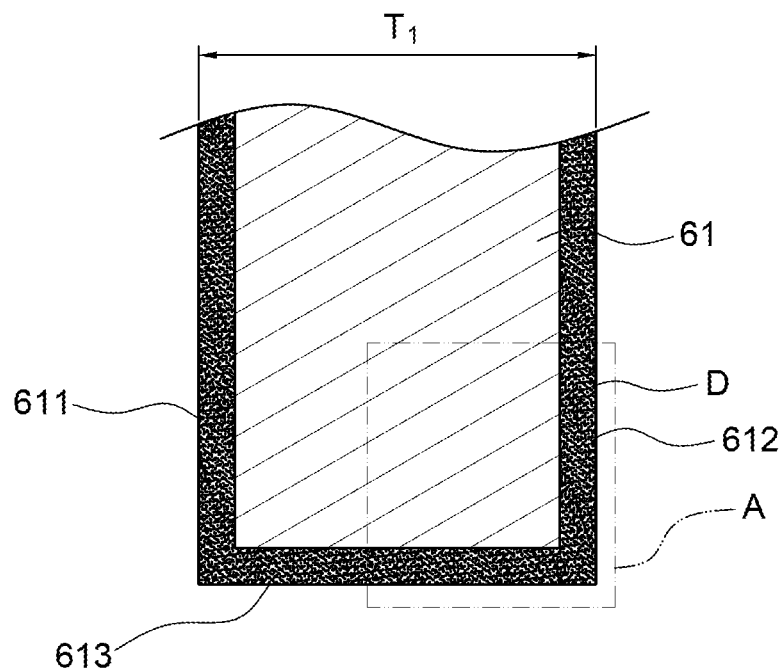
FIG. 8 illustrates a cross-sectional view of an example of a standard blade according to some embodiments of the present disclosure.

FIG. 8 illustrates a cross-sectional view of the standard blade 61. The standard blade 61 may be a rotary blade having a rectangular cross section on a rim thereof. That is, the standard blade 61 may have a first side surface 611, a second side surface 612 and a bottom surface 613 connecting the first side surface 611 and the second side surface 612. The first side surface 611 and the second side surface 612 may be substantially parallel to each other, and may be substantially perpendicular to the bottom surface 613. A thickness $T_1$ of the standard blade 61 may be about 0.2 mm to about 0.3 mm. The standard blade 61 may be made of metal.

Figure 9:
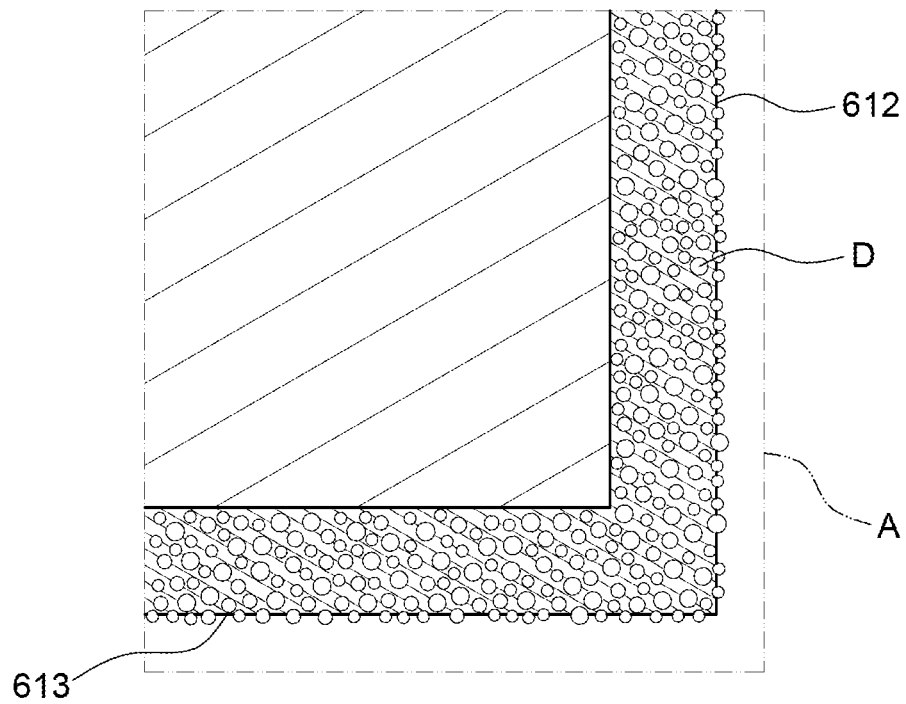
FIG. 9 illustrates an enlarged view of the area "A" in FIG. 8.

FIG. 9 illustrates an enlarged view of an area "A" in FIG. 8. The standard blade 61 is coated with a plurality of diamond grits D. For example, the first side surface 611, the second side surface 612 and the bottom surfaces 613 of the standard blade 61 may be coated with the diamond grits D. A size of the diamond grits D is about 8 μm to about 20 μm.

Figure 10:
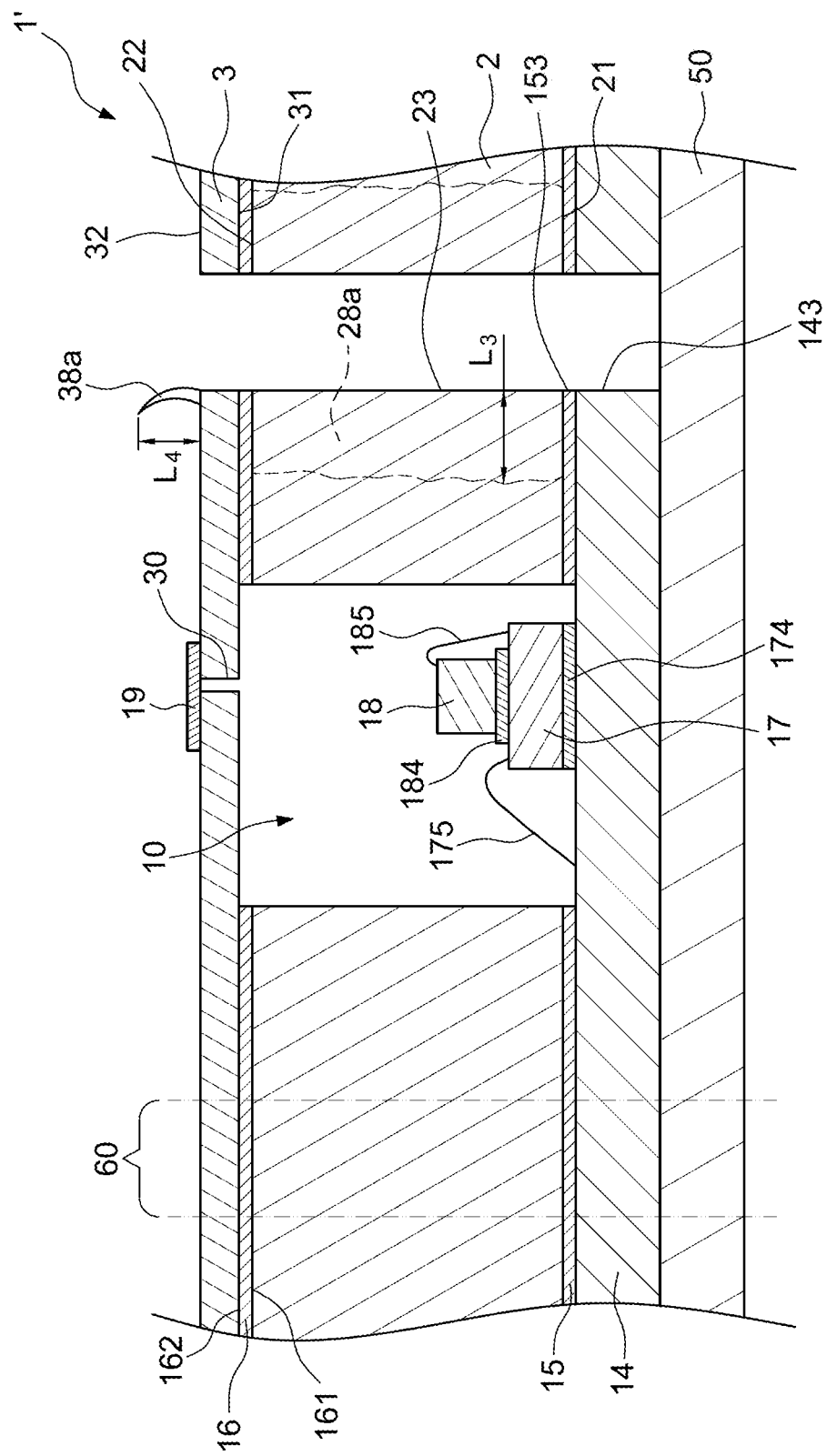
FIG. 10 illustrates one or more stages of an example of a method for manufacturing a stacked structure according to some embodiments of the present disclosure.

Referring to FIG. 10, after the cutting step shown in FIGS. 6 and 7, a lateral surface 23 of the polymer layer 2, a lateral surface 153 of the first adhesive layer 15 and a lateral surface 143 of the substrate 14 are formed. The lateral surface 23 of the polymer layer 2 extends between the first surface 21 and the second surface 22 of the polymer layer 2, and is substantially coplanar with the lateral surface 153 of the first adhesive layer 15 and the lateral surface 143 of the substrate 14. Meanwhile, side burrs may occur on the polymer layer 2 and/or the metal layer 3. For example, as show in FIG. 10, the polymer layer 2 has at least one burr 28a formed on the lateral surface 23. A burr length $L_3$ of the burr 28a may be greater than about 150 μm. The metal layer 3 also has at least one burr 38a formed on the second surface 32. A burr length $L_4$ of the burr 38a may be greater than about 7 μm.

Figure 11:
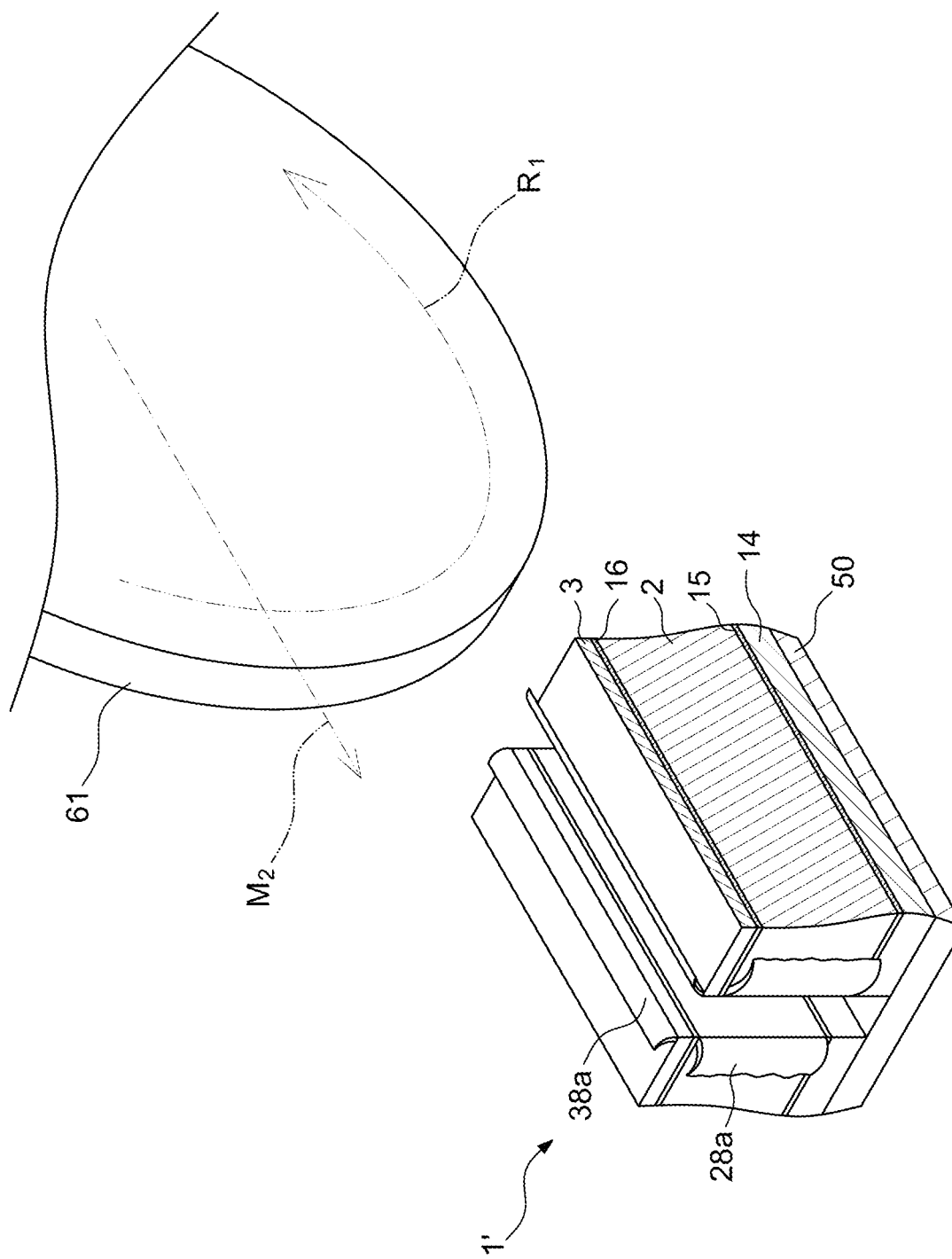
FIG. 11 illustrates one or more stages of an example of a method for manufacturing a stacked structure according to some embodiments of the present disclosure.
Figure 12:
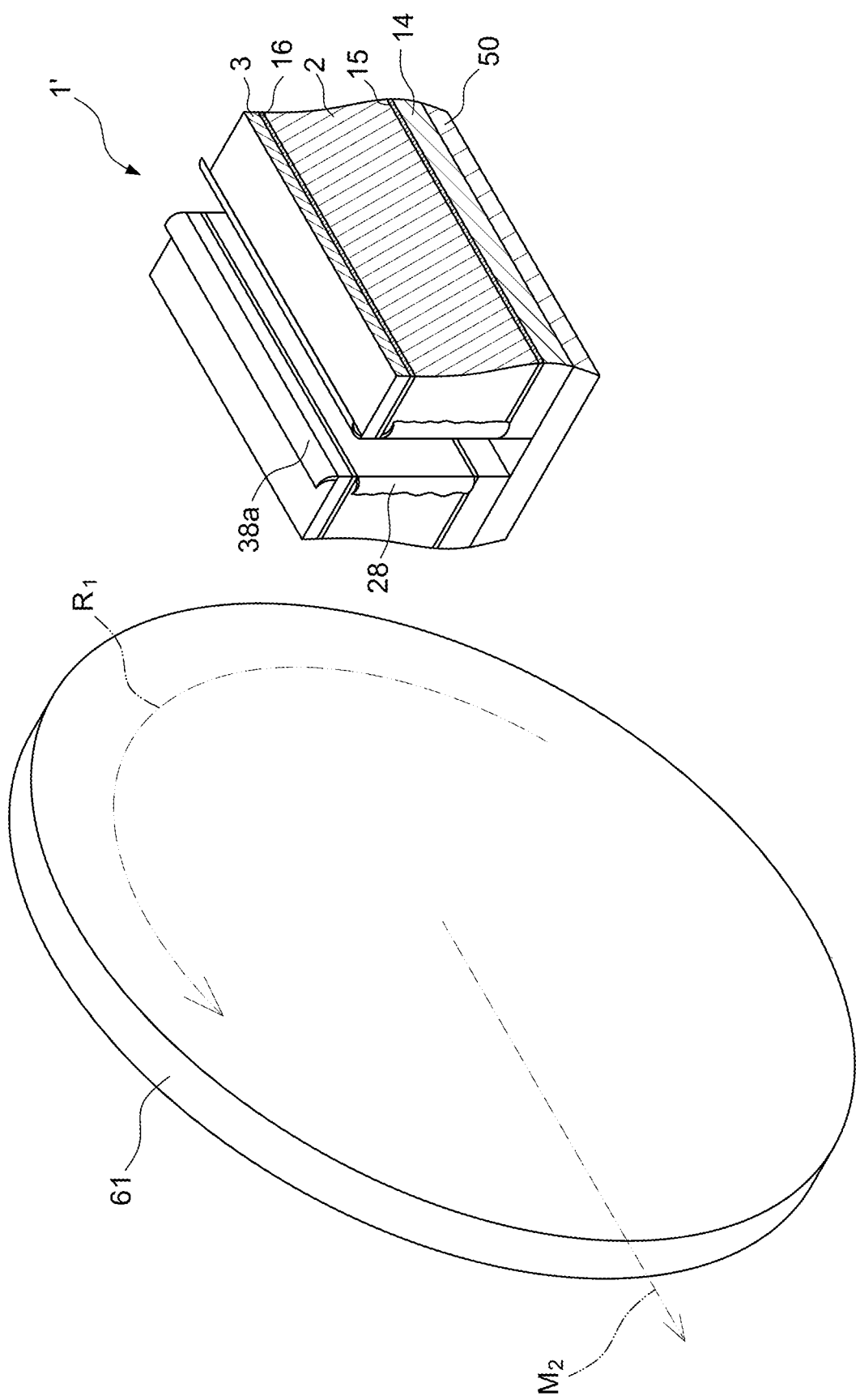
FIG. 12 illustrates one or more stages of an example of a method for manufacturing a stacked structure according to some embodiments of the present disclosure.

Referring to FIGS. 11 and 12, the standard blade 61 is then fed backward along a path of the stage shown in FIGS. 6 and 7 to trim the multi-layered structure 1'.

In the step shown in FIGS. 11 and 12, the standard blade 61 may be rotating in the rotation direction $R_1$, while moving along a feed direction $M_2$. The rotation direction $R_1$ of the standard blade 61 in the stage shown in FIGS. 11 and 12 is the same as the rotation direction $R_1$ of the standard blade 61 in the stage shown in FIGS. 6 and 7. The feed direction $M_2$ is opposite to the feed direction $M_1$ in the stage shown in FIGS. 6 and 7. The rotational speed and the feed speed may be the same as the step shown FIGS. 6 and 7. The standard blade 61 trims the lateral surface 23 of the polymer 2, so as to remove or reduce the side burrs on the polymer layer 2, such as the burr 28a.

Figure 13:
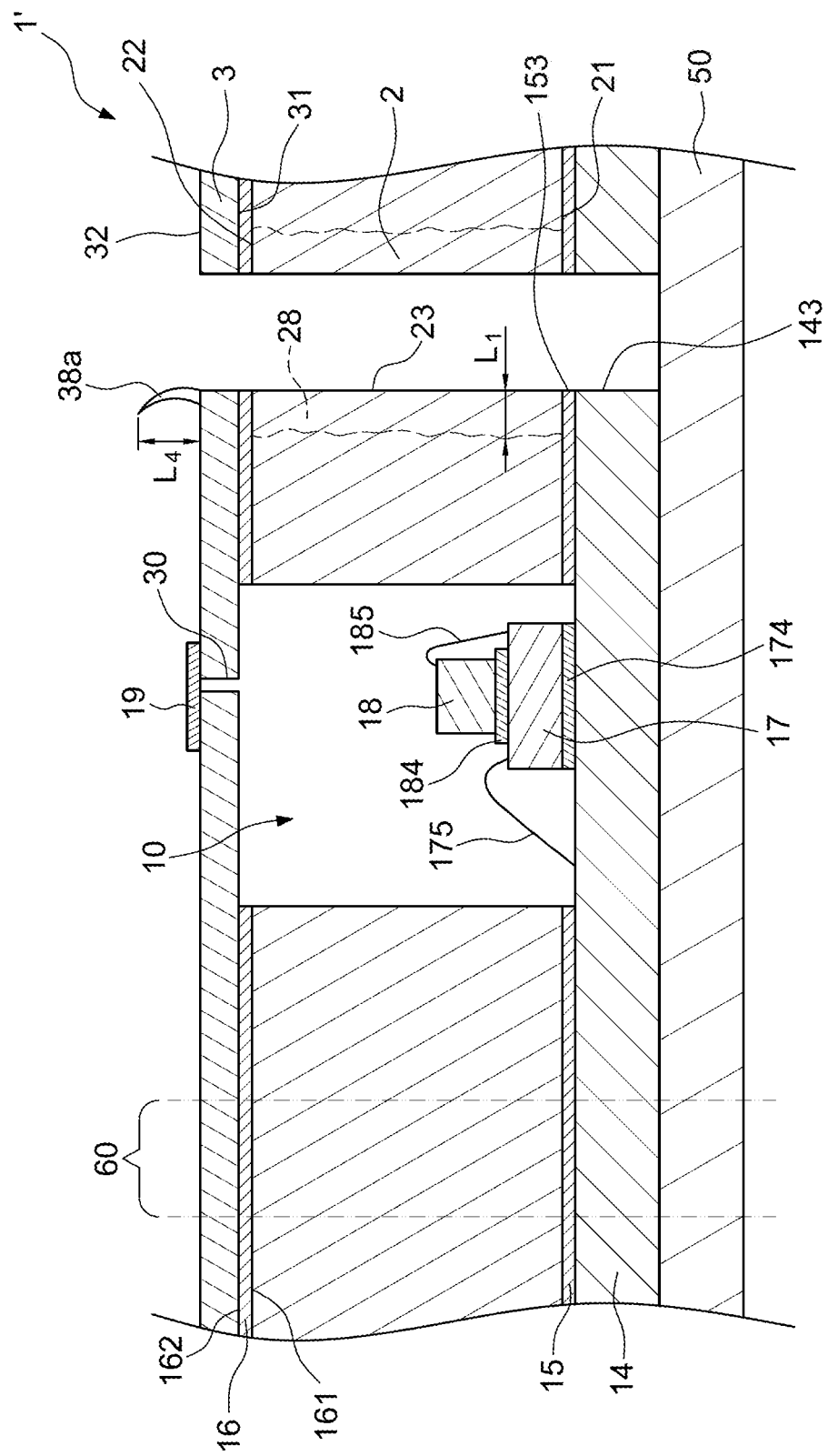
FIG. 13 illustrates one or more stages of an example of a method for manufacturing a stacked structure according to some embodiments of the present disclosure.

Referring to FIG. 13, after the stage shown in FIGS. 11 and 12, the burr 28a is removed or reduced. A smaller burr 28 occurs on the lateral surface 23 of the polymer layer 2, a burr length $L_1$ of the burr 28 is less than the burr length $L_3$ of the burr 28a shown in FIG. 10. For example, a burr length $L_1$ of the burr 28 on the lateral surface 23 of the polymer layer 2 is about 0.8 μm to about 150 μm.

Figure 14:
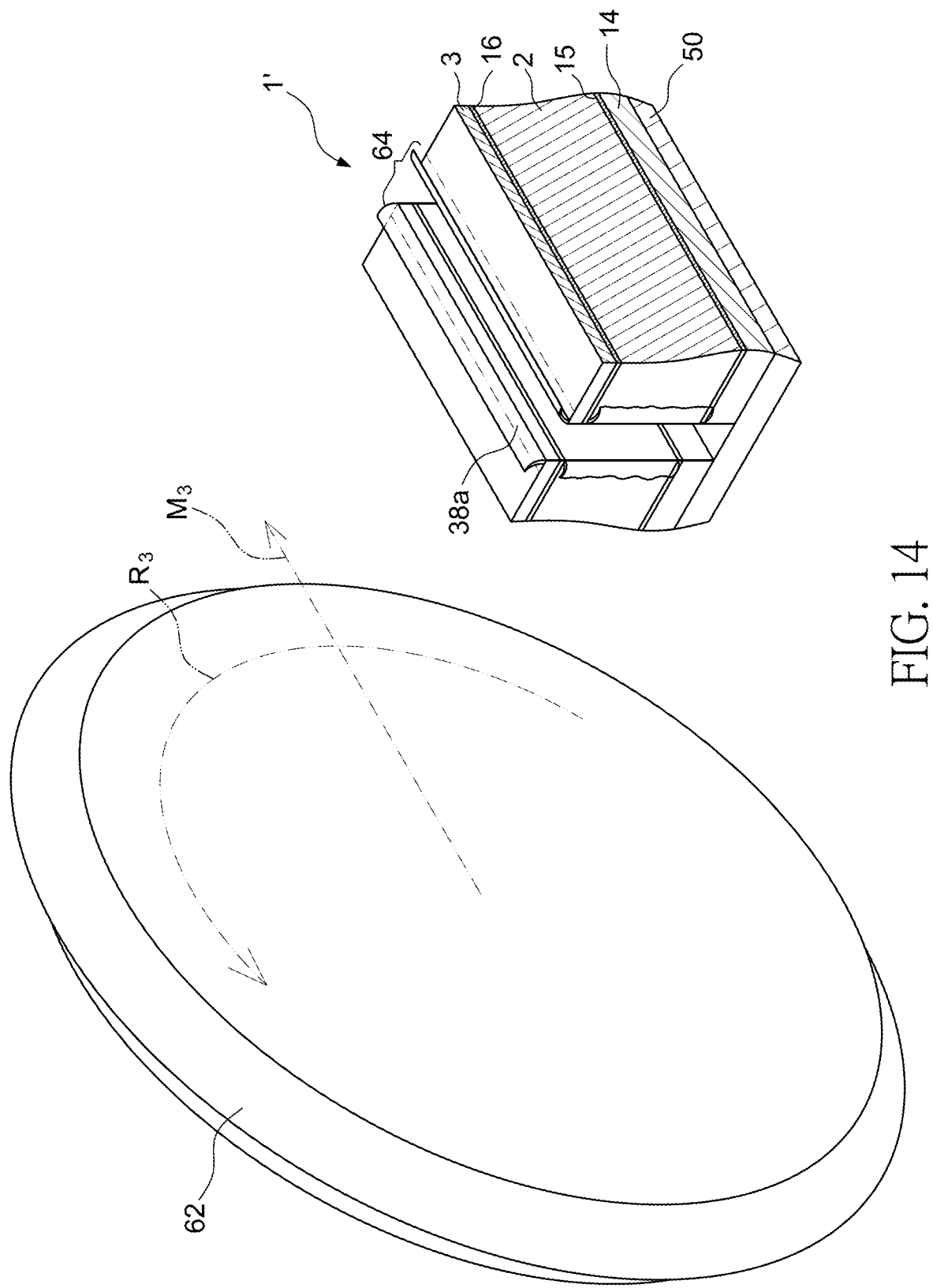
FIG. 14 illustrates one or more stages of an example of a method for manufacturing a stacked structure according to some embodiments of the present disclosure.
Figure 15:
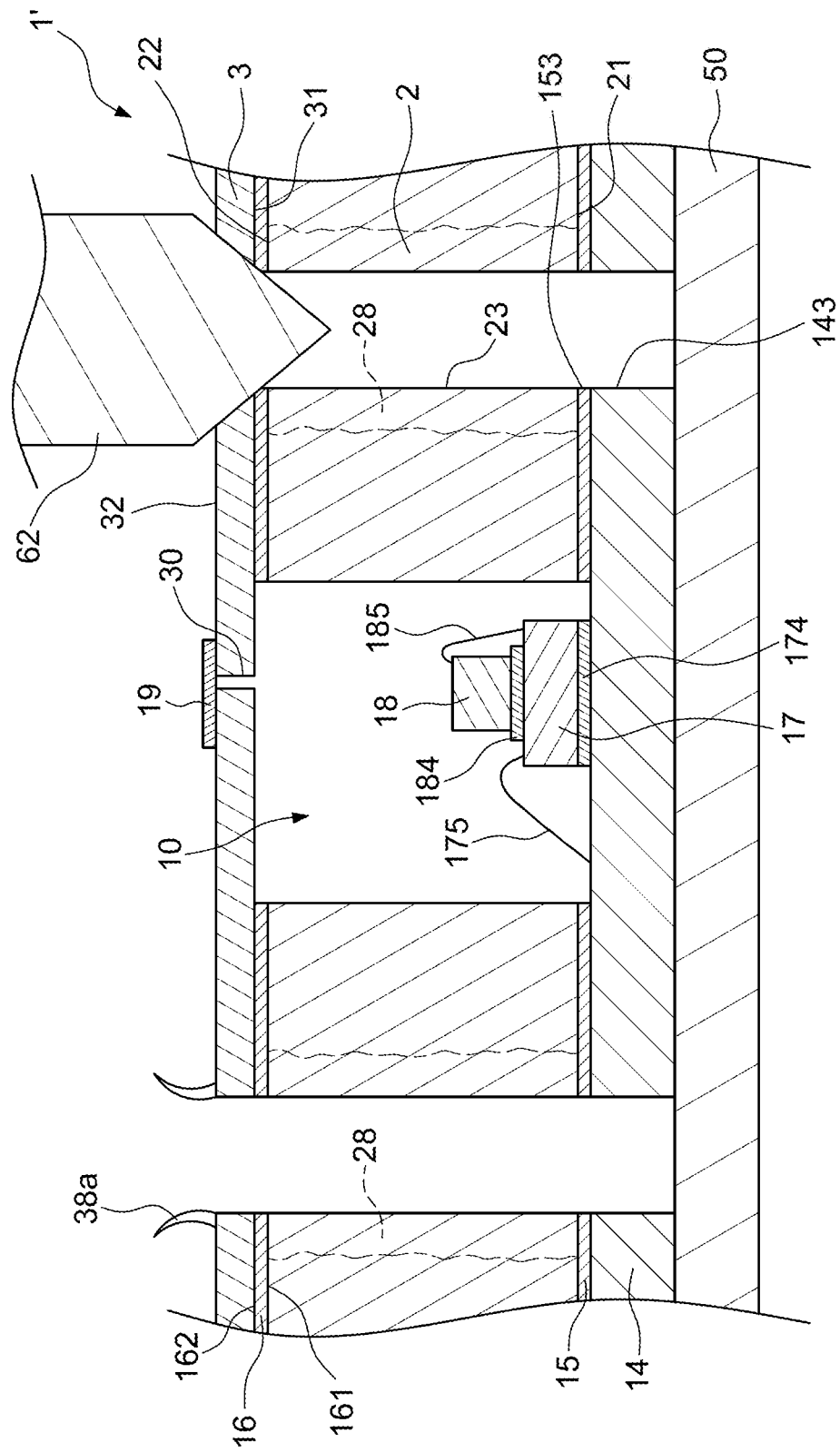
FIG. 15 illustrates one or more stages of an example of a method for manufacturing a stacked structure according to some embodiments of the present disclosure.

Referring to FIGS. 14 and 15, the metal layer 3 is then trimmed along the sawing streets 64 by using a V-shaped blade 62. The V-shaped blade 62 is rotating in a rotation direction $R_3$ and is moving along a feed direction $M_3$ toward the multi-layered structure 1'. The rotation direction $R_3$ and the feed direction $M_3$ of the V-shaped blade 62 of FIG. 14 may be the same as the rotation direction $R_1$ and the feed direction $M_1$ of the standard blade 61 of FIG. 6. The V-shaped blade 62 removes a portion of the metal layer 3. Hence, the burr 38a of the metal layer 3 is removed. In some embodiments, the V-shaped blade 62 may also remove a portion of the second adhesive layer 16. The V-shaped blade 62 may also be provided with a rotational speed of about 30,000 to about 40,000 rpm, and a feed speed of less than or equal to 10 mm/s, such as less than or equal to 7 mm/s, less than or equal to 5 mm/s or less than or equal to 3 mm/s.

Figure 16:
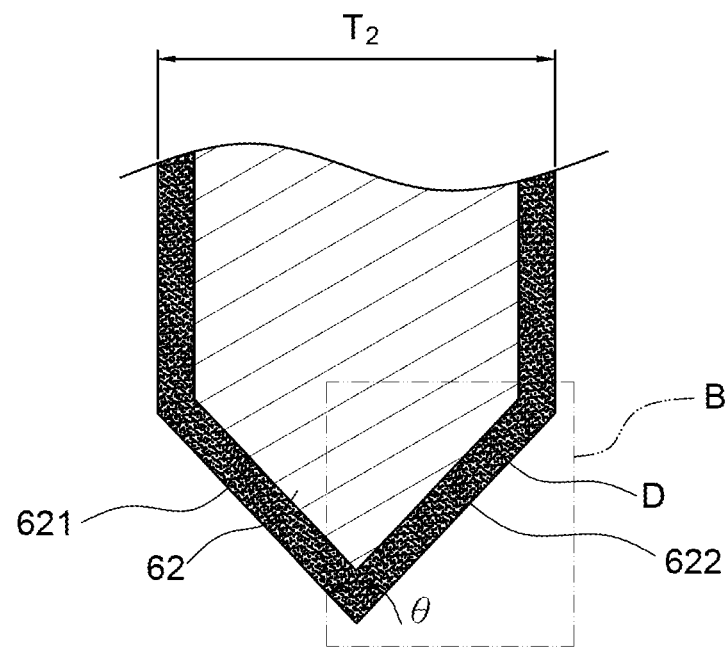
FIG. 16 illustrates a cross-sectional view of an example of a V-shaped blade according to some embodiments of the present disclosure.

FIG. 16 illustrates a cross-sectional view of the V-shaped blade 62. The V-shaped blade 61 may be a rotary blade having a V-shaped cross section on a rim thereof. That is, the V-shaped blade 61 may have a first side surface 621 and a second side surface 622. At least one of the first side surface 621 and the second side surface 622 has a portion not parallel to the other one of them. As shown in FIG. 16, the first side surface 621 intersects with the second side surface 622. A bevel angle θ of the V-shaped blade 62 is about 30 degrees (°) to about 120°. For example, the bevel angle θ may be defined as the inclination angle between the first side surface 621 and the second side surface 622. A thickness $T_2$ of the V-shaped blade 62 may be about 0.3 to about 0.4 mm.

The thickness $T_1$ of the standard blade 61 is less than the thickness $T_2$ of the V-shaped blade 62. The V-shaped blade 62 may be made of metal.

Figure 17:
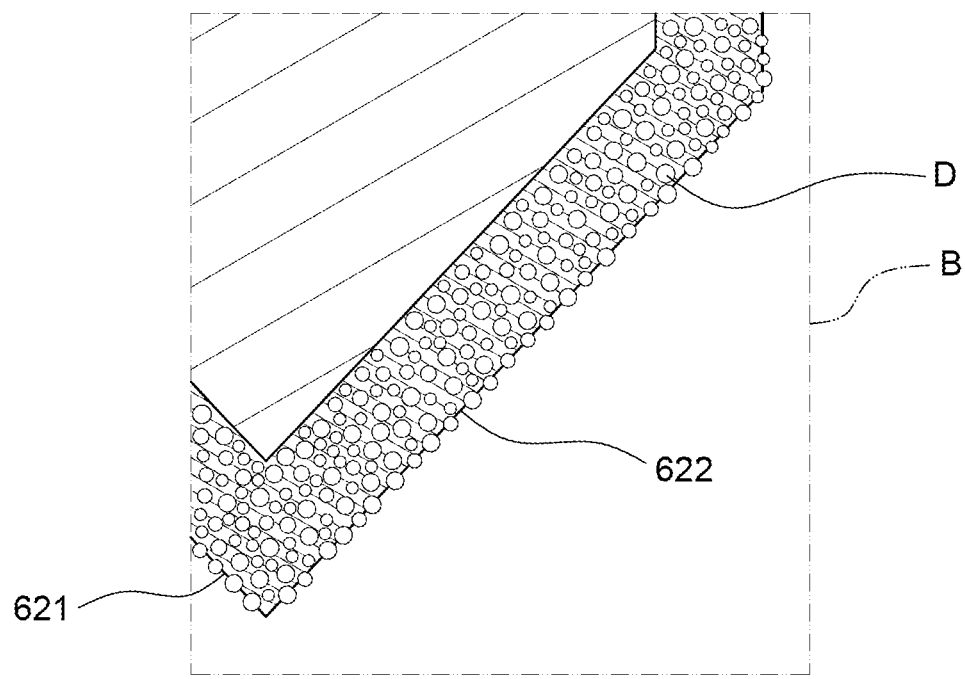
FIG. 17 illustrates an enlarged view of the area "B" in FIG. 16.

FIG. 17 illustrates an enlarged view of an area "B" in FIG. 16. The V-shaped blade 62 may be coated with a plurality of diamond grits D. For example, the entire first side surface 621 and the entire second side surface 622 are coated with diamond grits D. A size of the diamond grits D is about 8 μm to about 20 μm. In some embodiments, the V-shaped blade 62 may be replaced by any one of V-shaped blades 62a, 62b and 62c shown in FIGS. 18 to 20.

Figure 18:
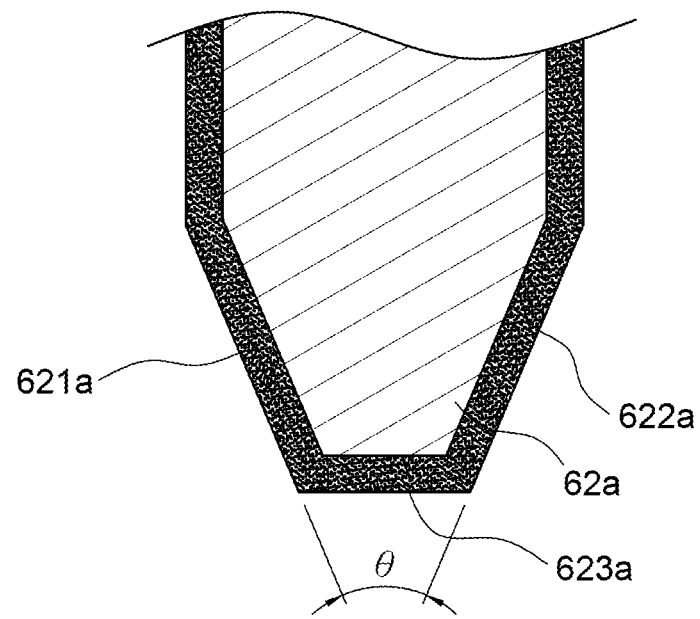
FIG. 18 illustrates a cross-sectional view of an example of a V-shaped blade according to some embodiments of the present disclosure.

FIG. 18 illustrates a cross-sectional view of a V-shaped blade 62a according to some embodiments of the present disclosure. As shown in FIG. 18, the V-shaped blade 62a has a first side surface 621a and a second side surface 622a, and further has a bottom surface 623a connected between the first side surface 621a and the second side surface 622a. At least one of the first side surface 621a and the second side surface 622a has a portion which is not parallel to the other one of them, and is not perpendicular to the bottom surface 623a. The bevel angle θ may be defined as the angle between the first side surface 621a and the second side surface 622a.

Figure 19:
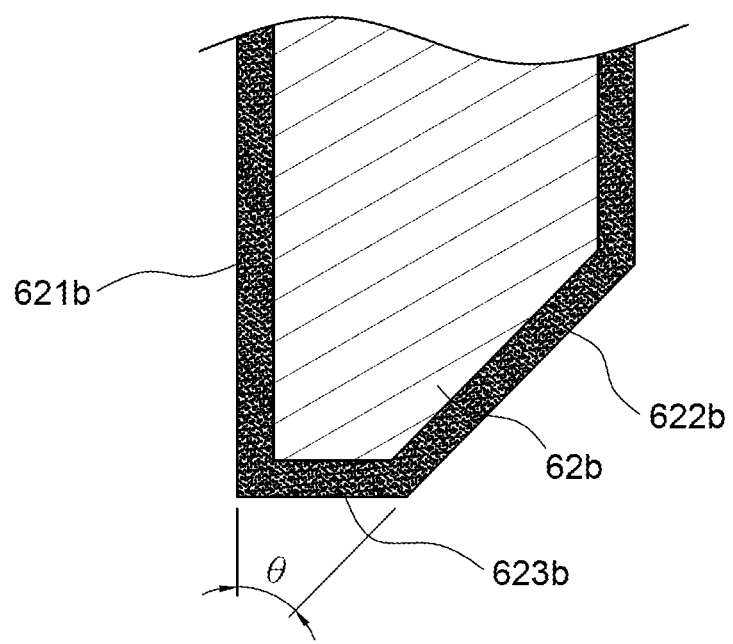
FIG. 19 illustrates a cross-sectional view of an example of a V-shaped blade according to some embodiments of the present disclosure.

FIG. 19 illustrates a cross-sectional view of a V-shaped blade 62b according to some embodiments of the present disclosure. As shown in FIG. 19, the V-shaped blade 62b has a first side surface 621b and a second side surface 622b, and further has a bottom surface 623b connected between the first side surface 621b and the second side surface 622b. The first side surface 621b is a substantially flat plane, and is substantially perpendicular to the bottom surface 623b. The second side surface 622b has a portion which is not parallel to the first side surface 621b and is not perpendicular to the bottom surface 623b. The bevel angle θ may be defined as the angle between the first side surface 621b and the second side surface 622b.

Figure 20:
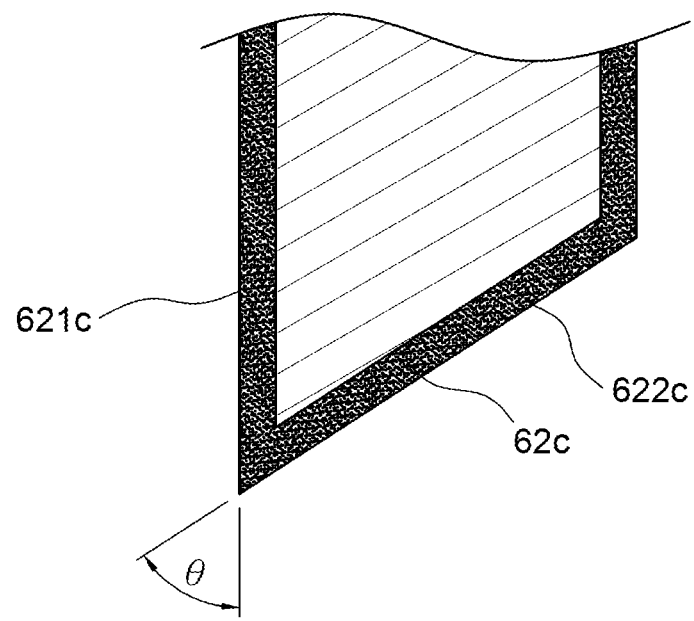
FIG. 20 illustrates a cross-sectional view of an example of a V-shaped blade according to some embodiments of the present disclosure.

FIG. 20 illustrates a cross-sectional view of a V-shaped blade 62c according to some embodiments of the present disclosure. As shown in FIG. 20, the V-shaped blade 62c may have a first side surface 621c and a second side surface 622c. The first side surface 621c is a substantially flat plane, while the second side surface 622c has a portion which is not parallel to the first side surface 621c. The bevel angle θ may be defined as the inclination angle between the first side surface 621c and the second side surface 622c.

Figure 21:
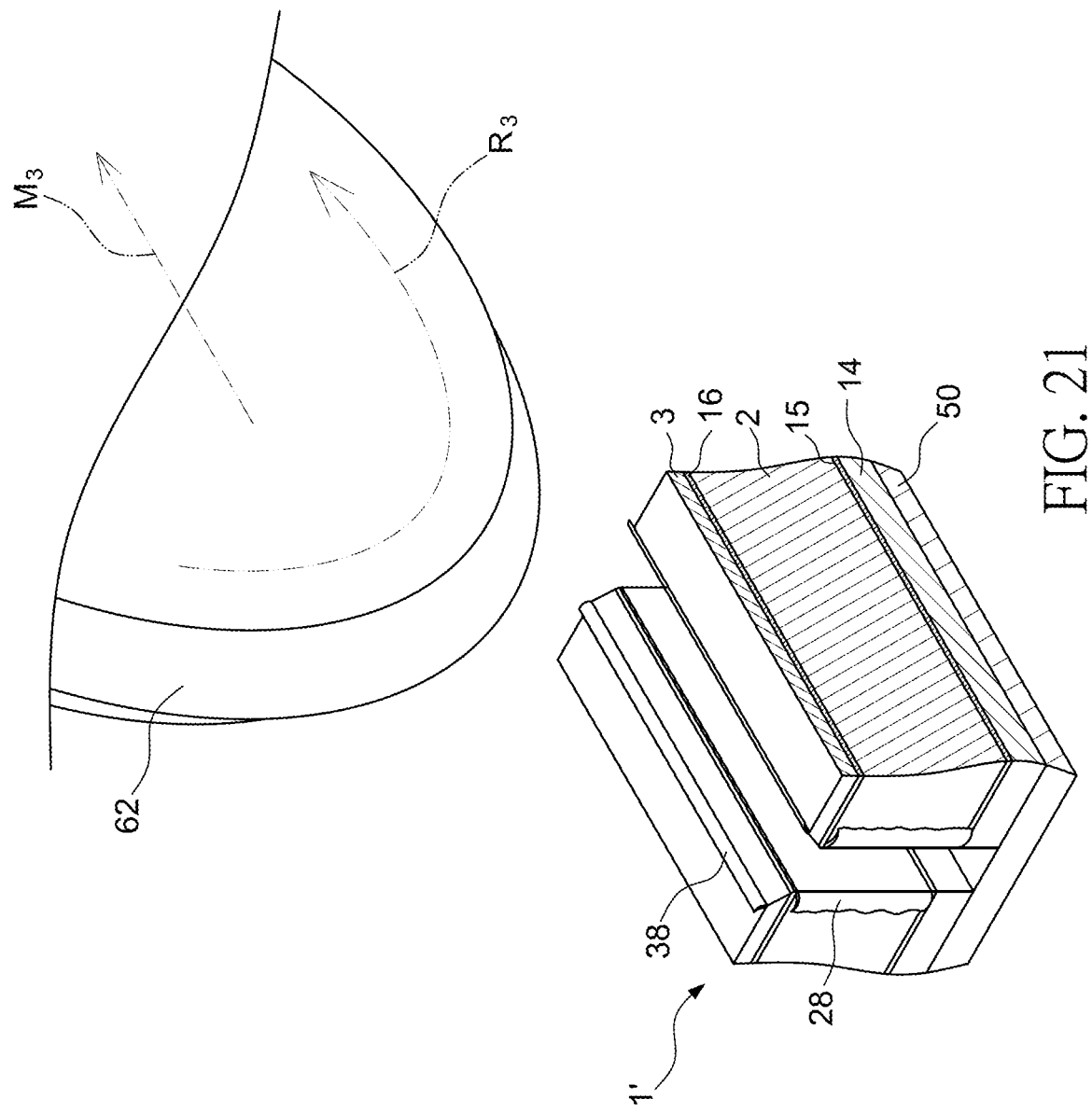
FIG. 21 illustrates one or more stages of an example of a method for manufacturing a stacked structure according to some embodiments of the present disclosure.
Figure 22:
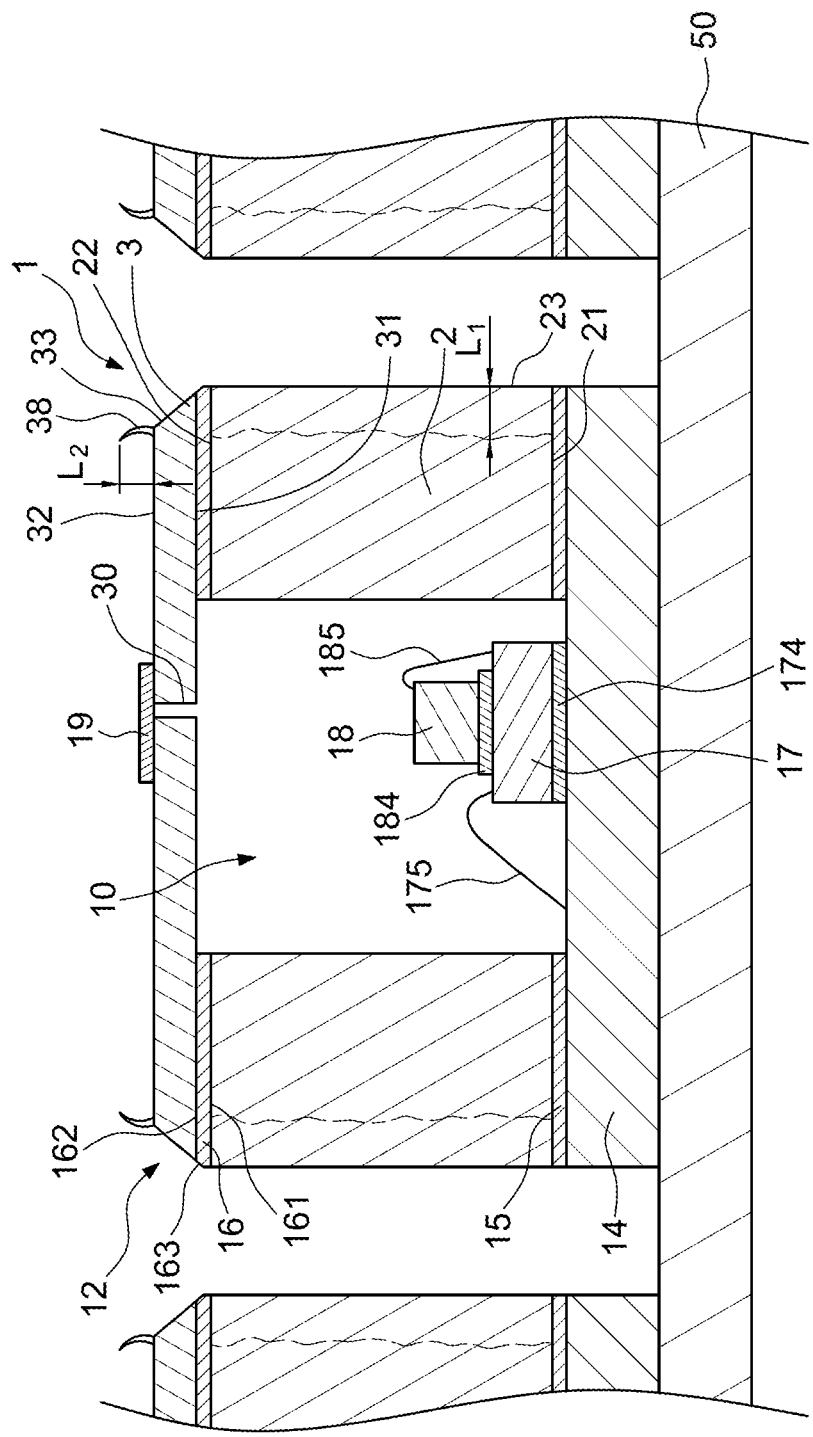
FIG. 22 illustrates one or more stages of an example of a method for manufacturing a stacked structure according to some embodiments of the present disclosure.

Referring to FIGS. 21 and 22, after the trimming step shown in FIGS. 14 and 15, a stacked structure is formed, such as the stacked structure 1 shown in FIG. 1. The burr 38a is removed, while a smaller burr 38 occurs one the metal layer 3. For example, a burr length $L_2$ of the burr 38 on the second surface 32 and/or the lateral surface 33 of the metal layer 3 is about 0.8 μm to about 7 μm. The stacked structure 1 has a lateral surface. For example, the lateral surface of the stacked structure 1 may include the lateral surface 143 of the substrate 14, the lateral surface 153 of the first adhesive layer 15, the lateral surface 23 of the polymer layer 2, the lateral surface 163 of the second adhesive layer 16, and the lateral surface 33 of the metal layer 3. The lateral surface of the stacked structure 1 defines an indentation structure 12. The indentation structure 12 is mainly defined by the lateral surface 33 of the metal layer 3. For example, the lateral surface 33 of the metal 3 is slanted toward the polymer layer 2 to define the indentation structure 12. The indentation structure 12 tapers downward. The lateral surface 163 may include a portion substantially coplanar with the lateral surface 23 of the polymer layer 2.

Then, the stacked structure 1 is picked or separated from carrier 50. In the method shown in FIG. 6 through FIG. 22, the multi-layered structure 1' is cut through by using the standard blade 61 (e.g., in the stages shown in FIG. 6 through FIG. 13) and the V-shaped blade 62 (e.g., in the stages shown in FIG. 14 through FIG. 22). Accordingly, burr length of the resultant stacked structure 1 may be reduced.

Not willing to be bound by any theory, it is believed that the V-shaped cross section of the V-shaped blade 62 may help to reduce the burr length of the metal layer 3. Such effect of the V-shaped blade 62 is not significantly affected by the bevel angle θ and/or the exact cross section of the V-shaped blade 62. For example, experimental result shows that each of the V-shaped blades 62a, 62b and 62c shown in FIGS. 16 to 20 can sufficiently reduce the burr length.

Figure 23:
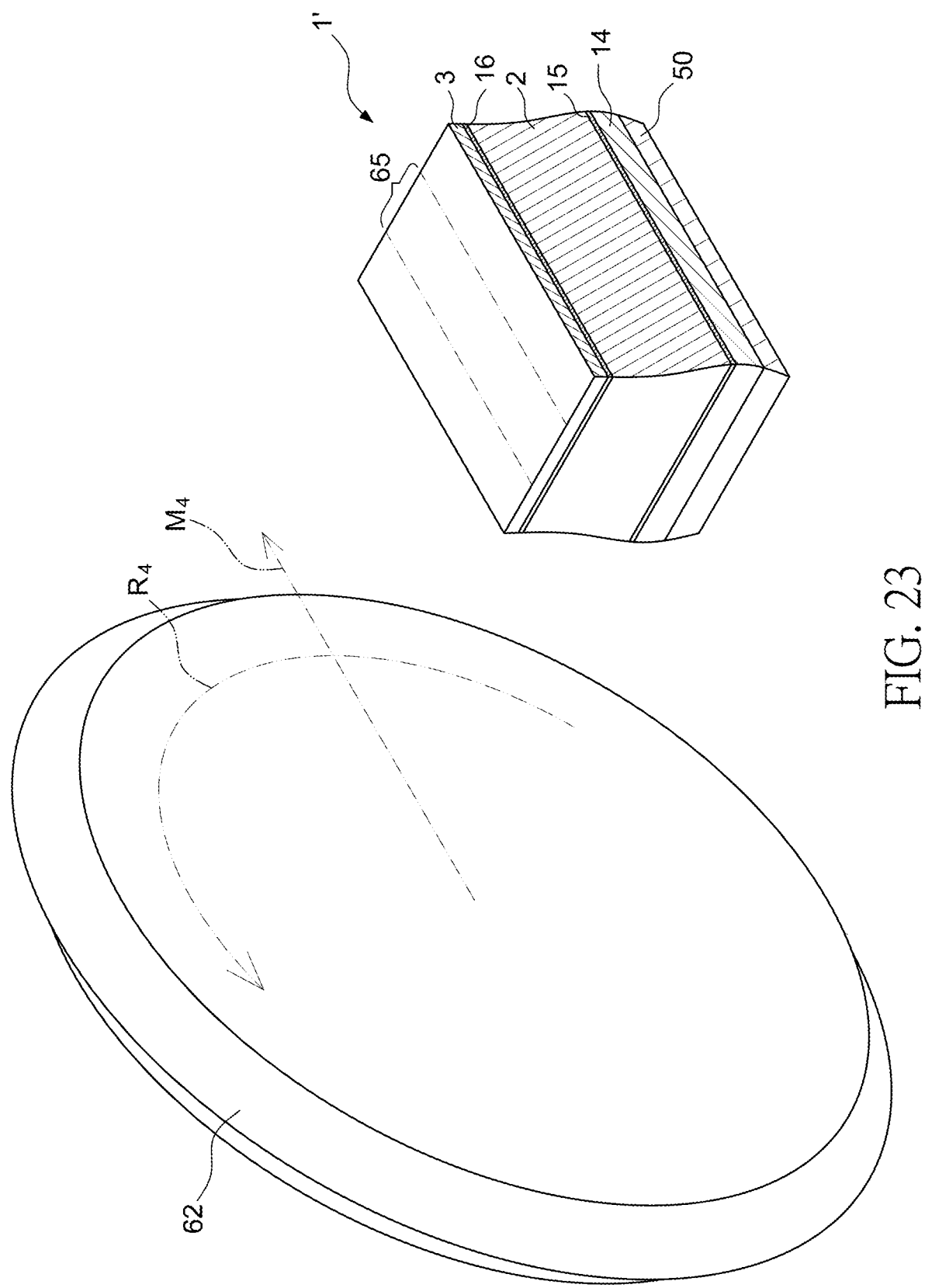
FIG. 23 illustrates one or more stages of an example of a method for manufacturing a stacked structure according to some embodiments of the present disclosure.
Figure 24:
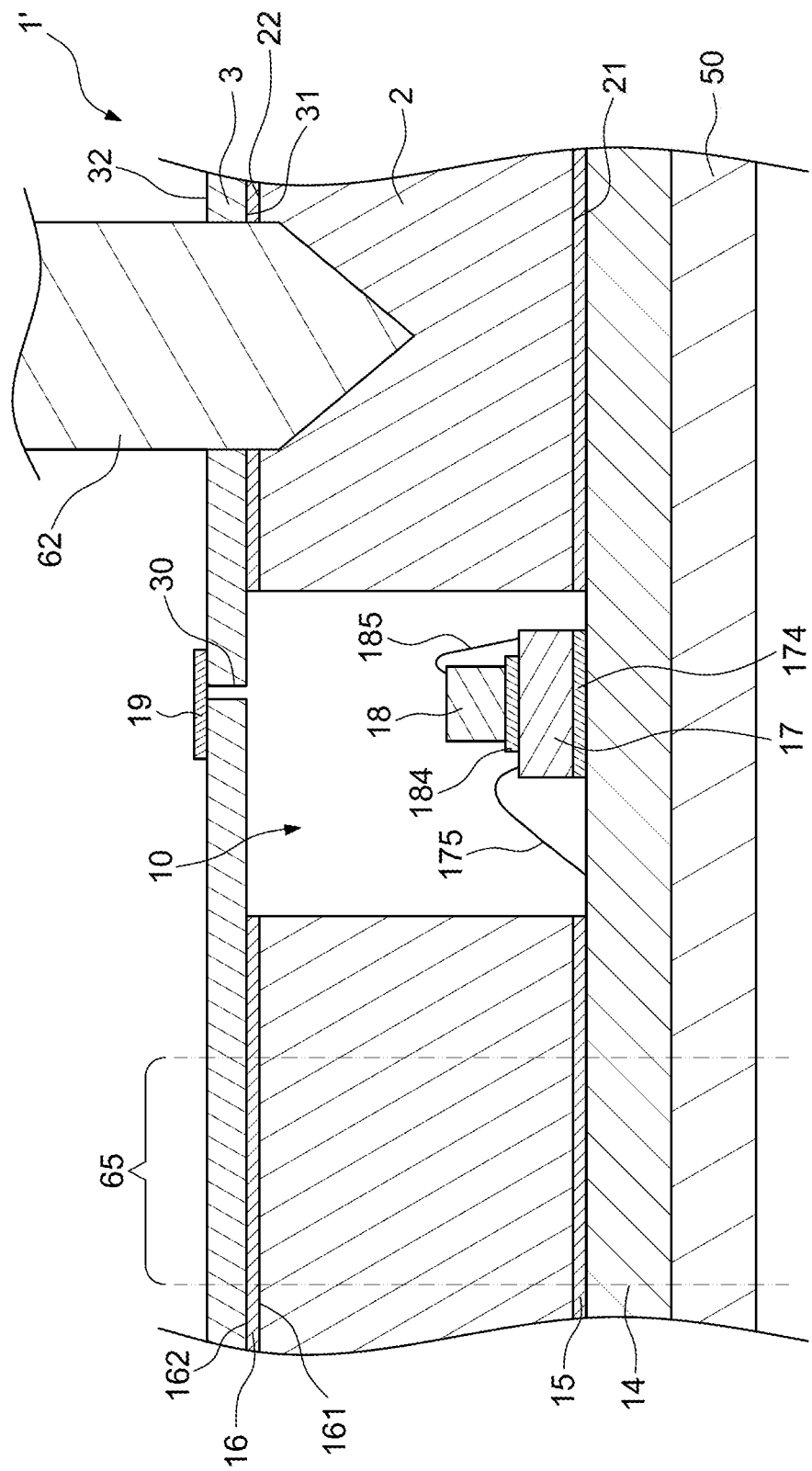
FIG. 24 illustrates one or more stages of an example of a method for manufacturing a stacked structure according to some embodiments of the present disclosure.

FIG. 23 through FIG. 32 illustrates a method for forming a stacked structure according to some embodiments of the present disclosure, such as the stacked structure 1a shown in FIG. 2. The initial stage of the illustrated process is the same as, or similar to, the stage illustrated in FIG. 5. FIGS. 23 and 24 depict a stage subsequent to that depicted in FIG. 5.

Referring to FIGS. 23 and 24, the metal layer 3 of the multi-layered structure 1' is cut through along a saw street 65 by using a V-shaped blade 62 which is similar to the V-shaped blade 62 used in the method described according to FIG. 5 through FIG. 22. The V-shaped blade 62 may also be replaced by any one of the V-shaped blades 62a, 62b and 62c shown in FIGS. 18 to 20. The V-shaped blade 62 is rotating in a rotation direction $R_4$ and is moving along a feed direction $M_4$ toward the multi-layered structure 1'. The rotation direction $R_4$ and the feed direction $M_4$ of the V-shaped blade 62 of FIG. 23 may be the same as the rotation direction $R_3$ and the feed direction $M_3$ of the V-shaped blade 62 of FIG. 14. The V-shaped blade 62 cuts through the metal layer 3. In some embodiments, the V-shaped blade 62 may also cut through the second adhesive layer 16, and may cut a portion of the polymer layer 2. The V-shaped blade 62 may also be provided with a rotational speed of about 30,000 to about 40,000 rpm, and a feed speed of less than or equal to 10 mm/s, such as less than or equal to 7 mm/s, less than or equal to 5 mm/s or less than or equal to 3 mm/s.

Figure 25:
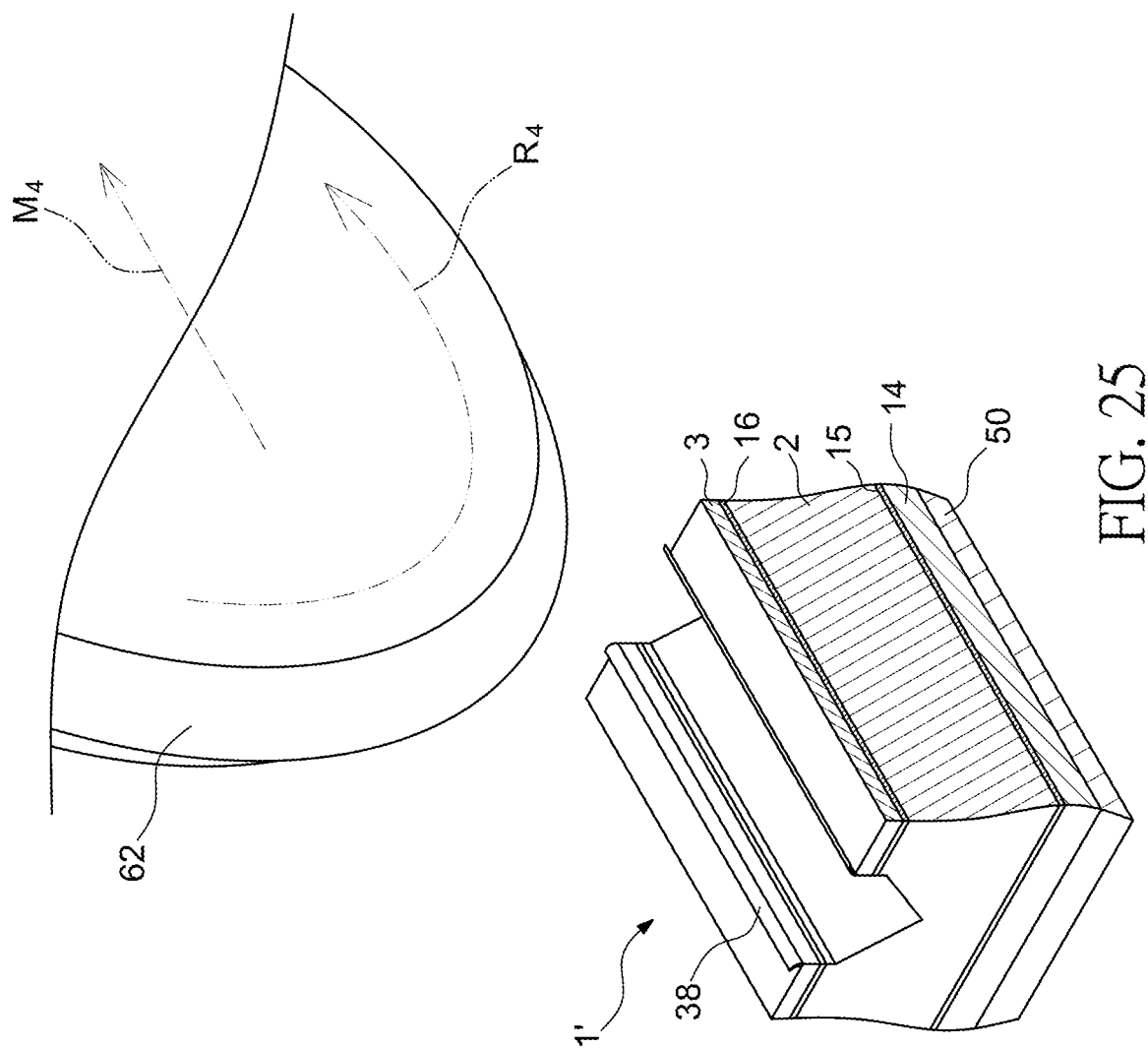
FIG. 25 illustrates one or more stages of an example of a method for manufacturing a stacked structure according to some embodiments of the present disclosure.
Figure 26:
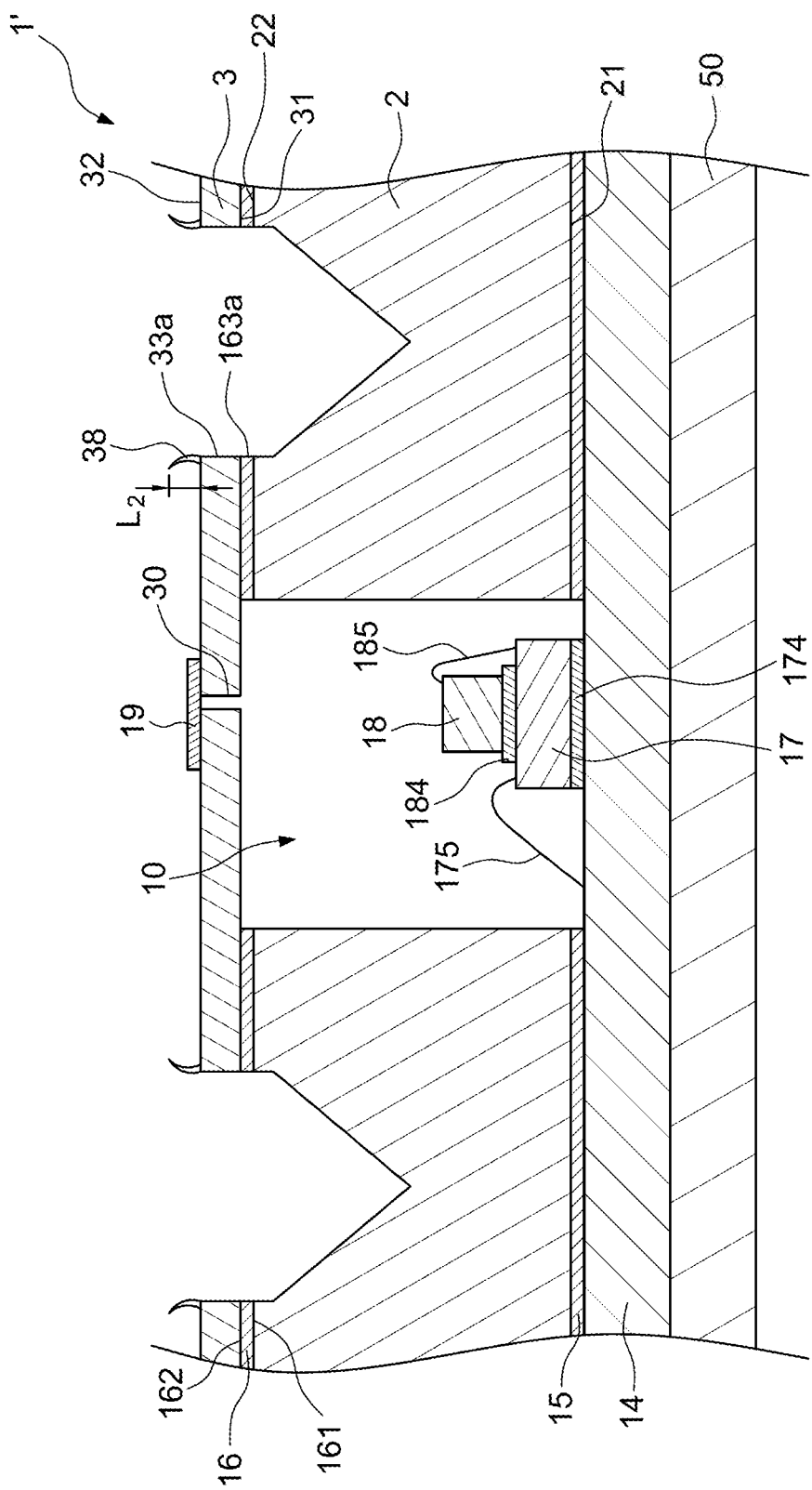
FIG. 26 illustrates one or more stages of an example of a method for manufacturing a stacked structure according to some embodiments of the present disclosure.

Referring to FIGS. 25 and 26, after the cutting step shown in FIGS. 23 and 24, a lateral surface 33a of the metal layer 3 and a lateral surface 163a of the second adhesive layer 16 are formed and are substantially coplanar with each other. Meanwhile, burrs may occur on the metal layer 3. The metal layer 3 may have at least one burr on the first surface 31 and/or the lateral surface 33a, such as the burr 38. As discussed above, due to the V-shaped cross section, the V-shaped blade 62 may reduce the burr length of the metal layer 3. Accordingly, a burr length $L_2$ of the burr 38 on the second surface 32 and/or the lateral surface 33a of the metal layer 3 is about 0.8 μm to about 7 μm.

Figure 27:
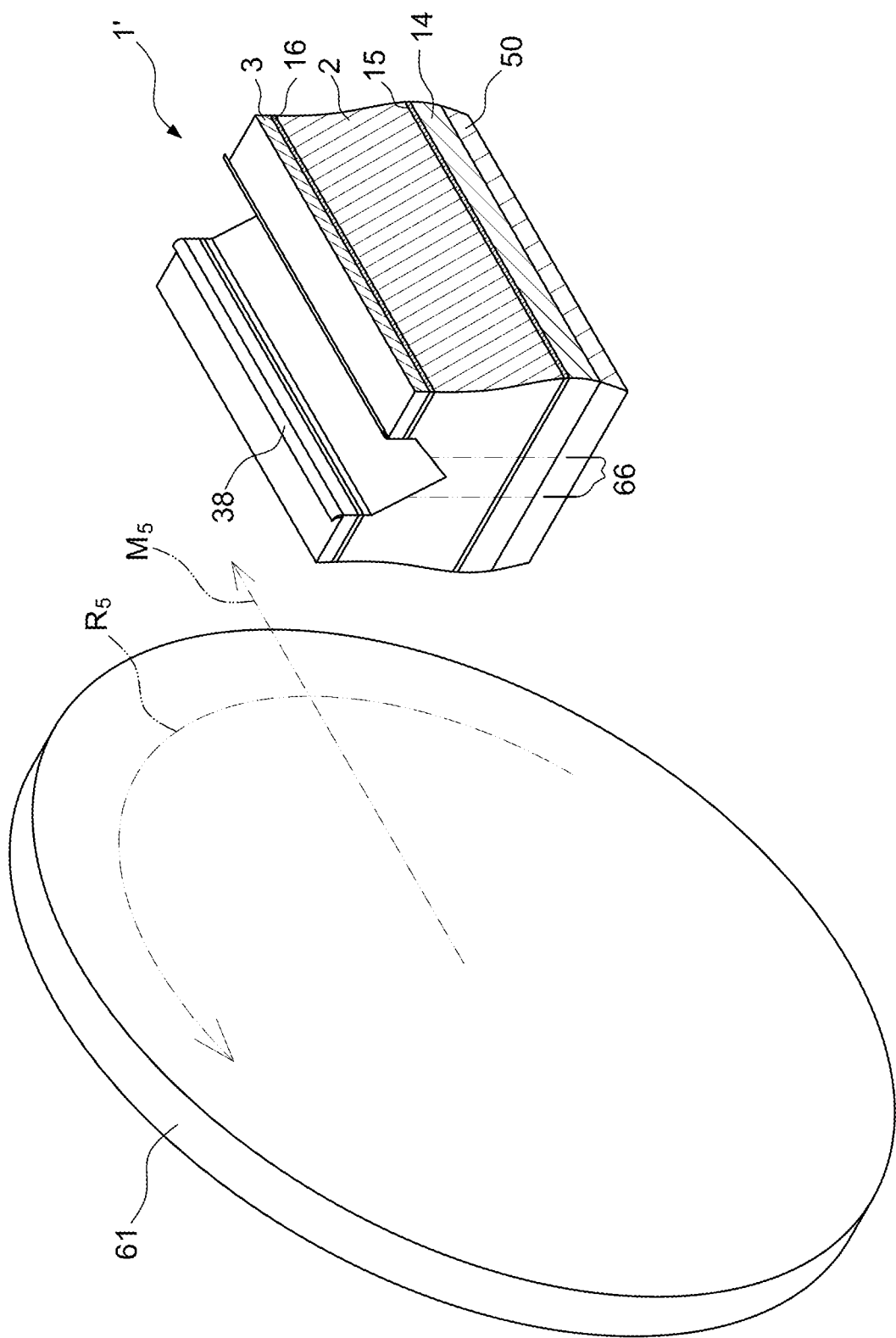
FIG. 27 illustrates one or more stages of an example of a method for manufacturing a stacked structure according to some embodiments of the present disclosure.
Figure 28:
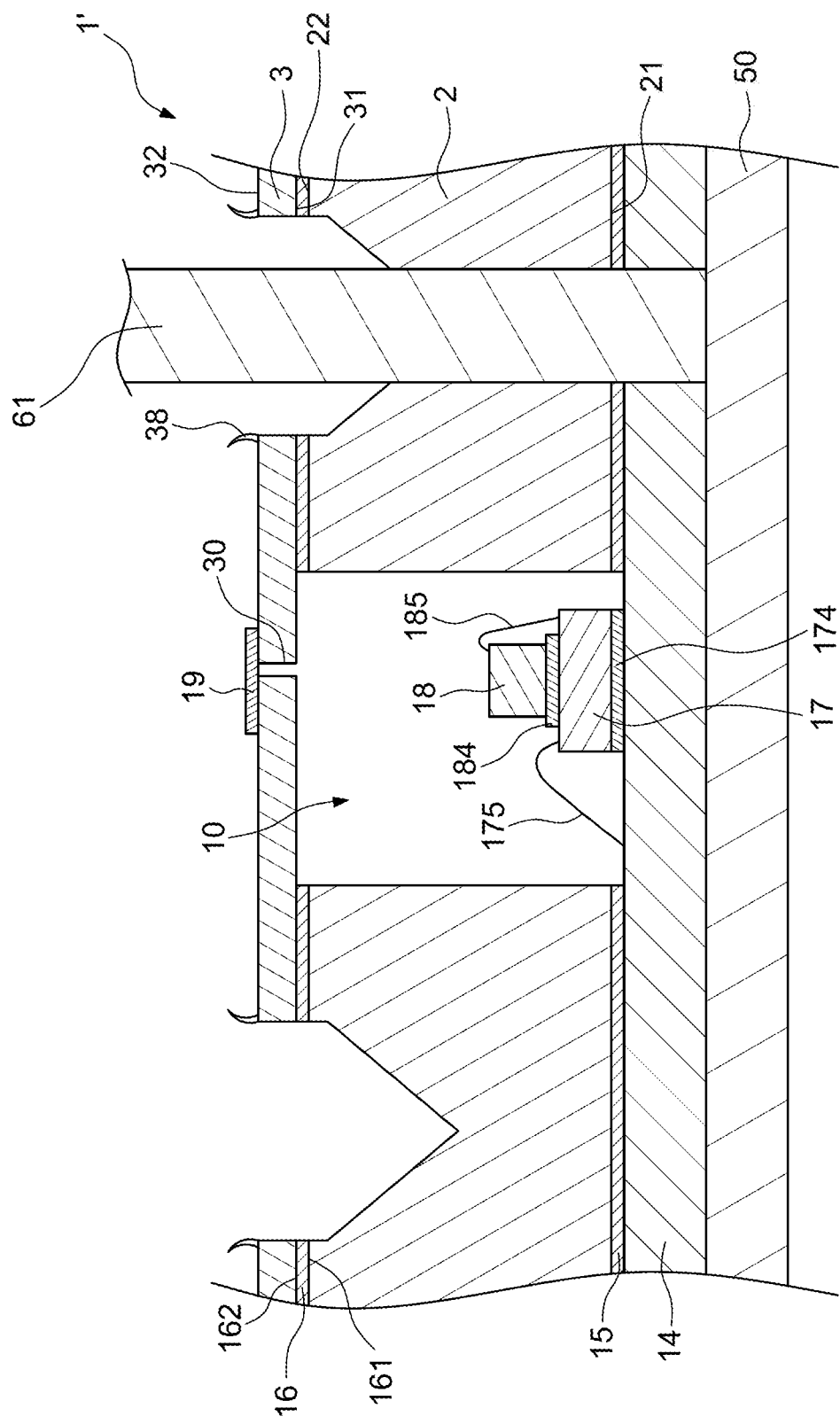
FIG. 28 illustrates one or more stages of an example of a method for manufacturing a stacked structure according to some embodiments of the present disclosure.

Referring to FIGS. 27 and 28, the polymer layer 2 is then cut through along a saw street 66 by using a standard blade 61 which is similar to the standard blade 61 used in the method described according to FIG. 6 through FIG. 22. The saw street 66 of FIG. 27 is disposed within the saw street 65 of FIG. 23. For example, the standard blade 61 is rotating along a rotation direction $R_5$ while moving along a feed direction $M_5$ toward the multi-layered structure 1'. A tangential velocity of the standard blade 61 at a bottommost point thereof is in a direction parallel to the feed direction $M_5$. The standard blade 61 may be provided with a rotational speed of about 30,000 to about 40,000 rpm, and a feed speed of less than or equal to 10 mm/s, such as less than or equal to 7 mm/s, less than or equal to 5 mm/s or less than or equal to 3 mm/s. The standard blade 61 cuts through the polymer layer 2, the first adhesive layer 15 and the substrate 14 to reach the carrier 50. In some embodiments, the standard blade 61 may also cut a portion of the carrier 50.

Figure 29:
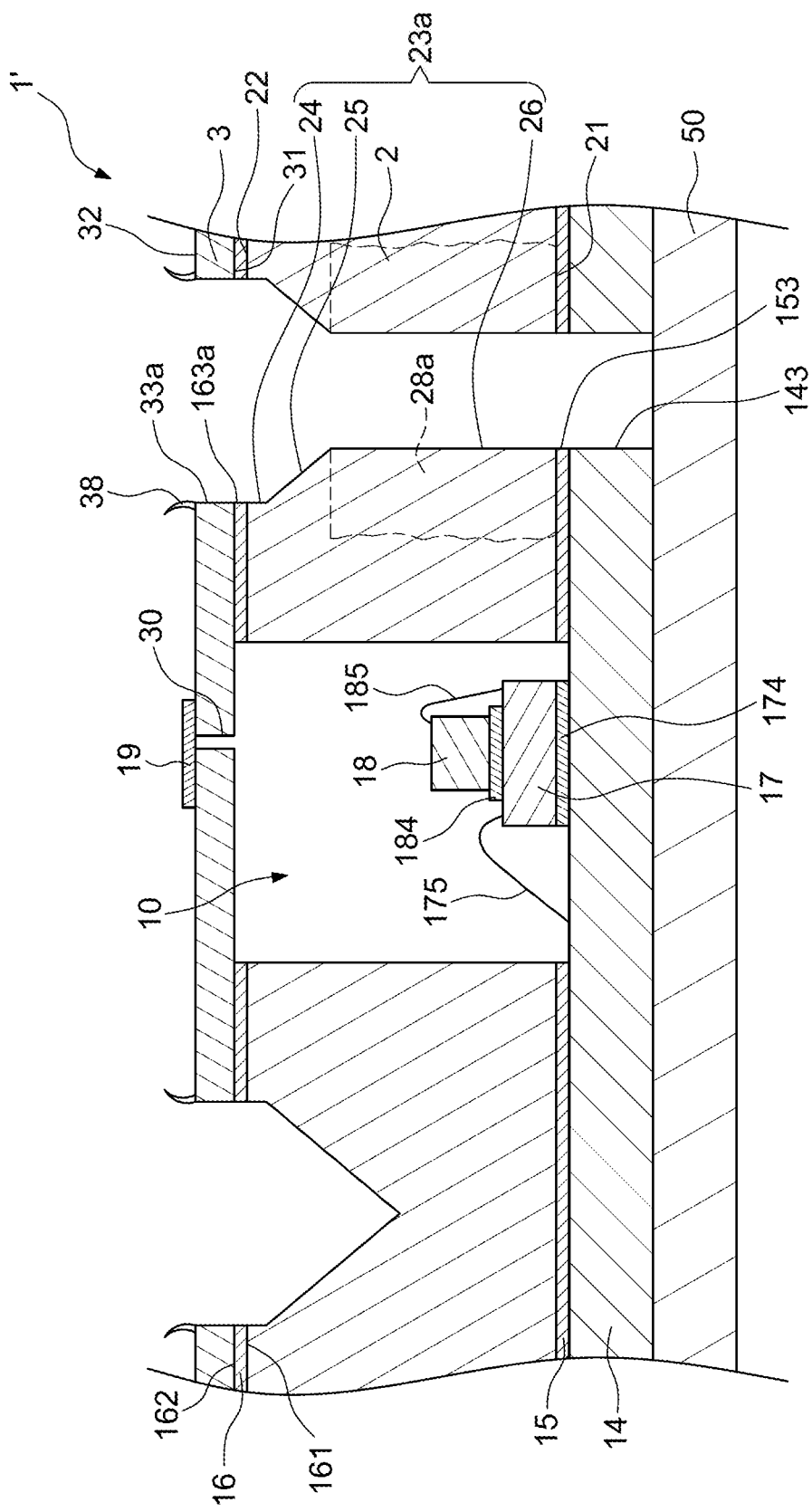
FIG. 29 illustrates one or more stages of an example of a method for manufacturing a stacked structure according to some embodiments of the present disclosure.

Referring to FIG. 29, after the cutting step shown in FIGS. 27 and 28, a lateral surface 23a of the polymer layer 2, a lateral surface 153 of the first adhesive layer 15 and a lateral surface 143 of the substrate 14 are formed. The lateral surface 23a of the polymer layer 2 extends between the first surface 21 and the second surface 22 of the polymer layer 2. The lateral surface 23a may have a first portion 24, a slanted portion 25 and a second portion 26. Each of the first portion 24, the slanted portion 25 and the second portion 26 are not coplanar to the others. The first portion 24 is substantially coplanar with the lateral surface 33a of the metal layer 3 and/or the lateral surface 163a of the second adhesive layer 16. The second portion 26 is substantially coplanar with the lateral surface 143 of the substrate 14 and/or the lateral surface 153 of the first adhesive layer 15. The slanted portion 25 connects the first portion 24 and the second portion 26. A portion of the polymer layer 2 (e.g., corresponding to the slanted portion 25 of the lateral surface 23a of the polymer layer 2) tapers upward.

Meanwhile, side burrs may occur on the polymer layer 2. For example, as show in FIG. 29, the polymer layer 2 has at least one burr 28a formed on the lateral surface 23a. A burr length $L_3$ of the burr 28a may be greater than about 150 μm.

Figure 30:
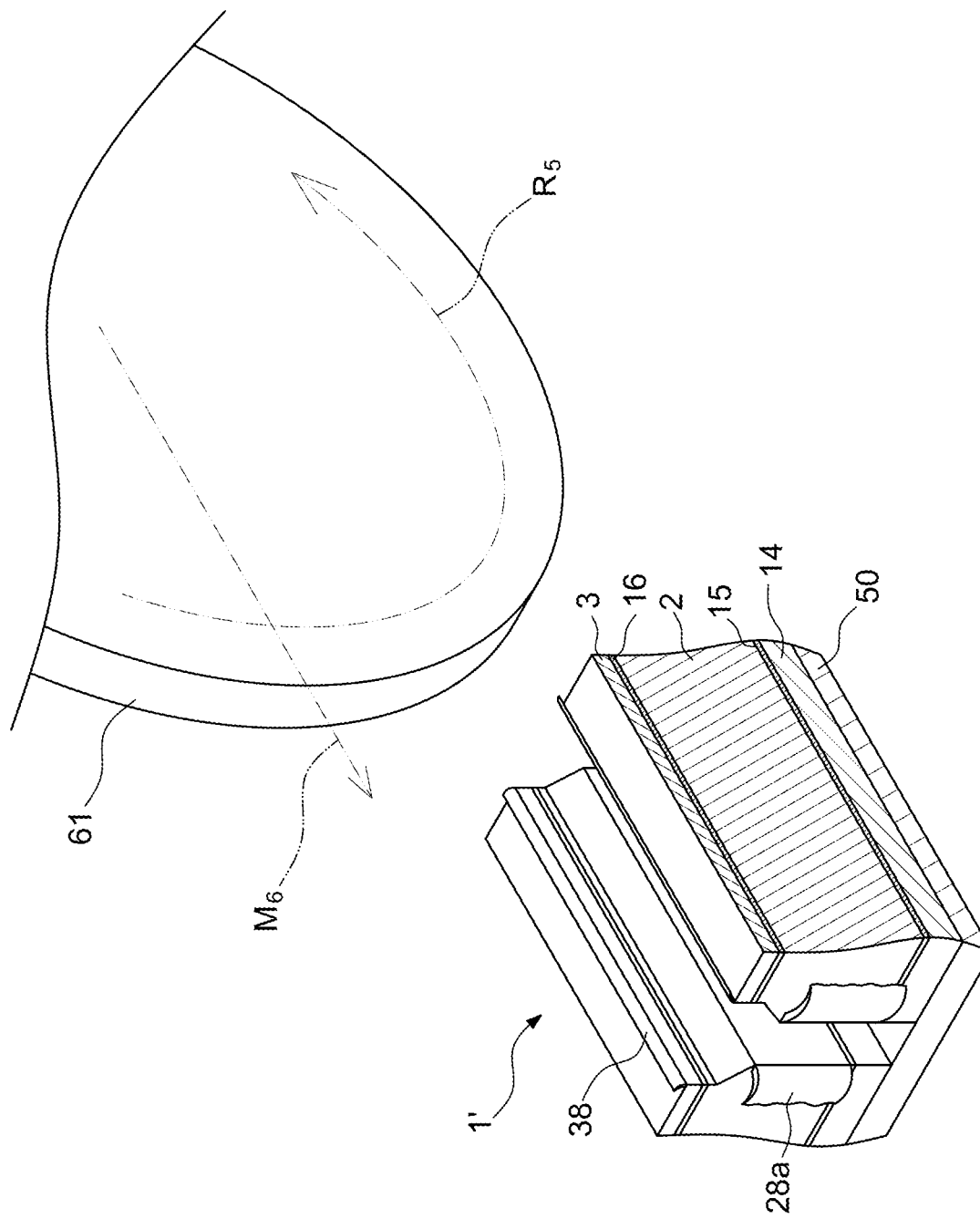
FIG. 30 illustrates one or more stages of an example of a method for manufacturing a stacked structure according to some embodiments of the present disclosure.
Figure 31:
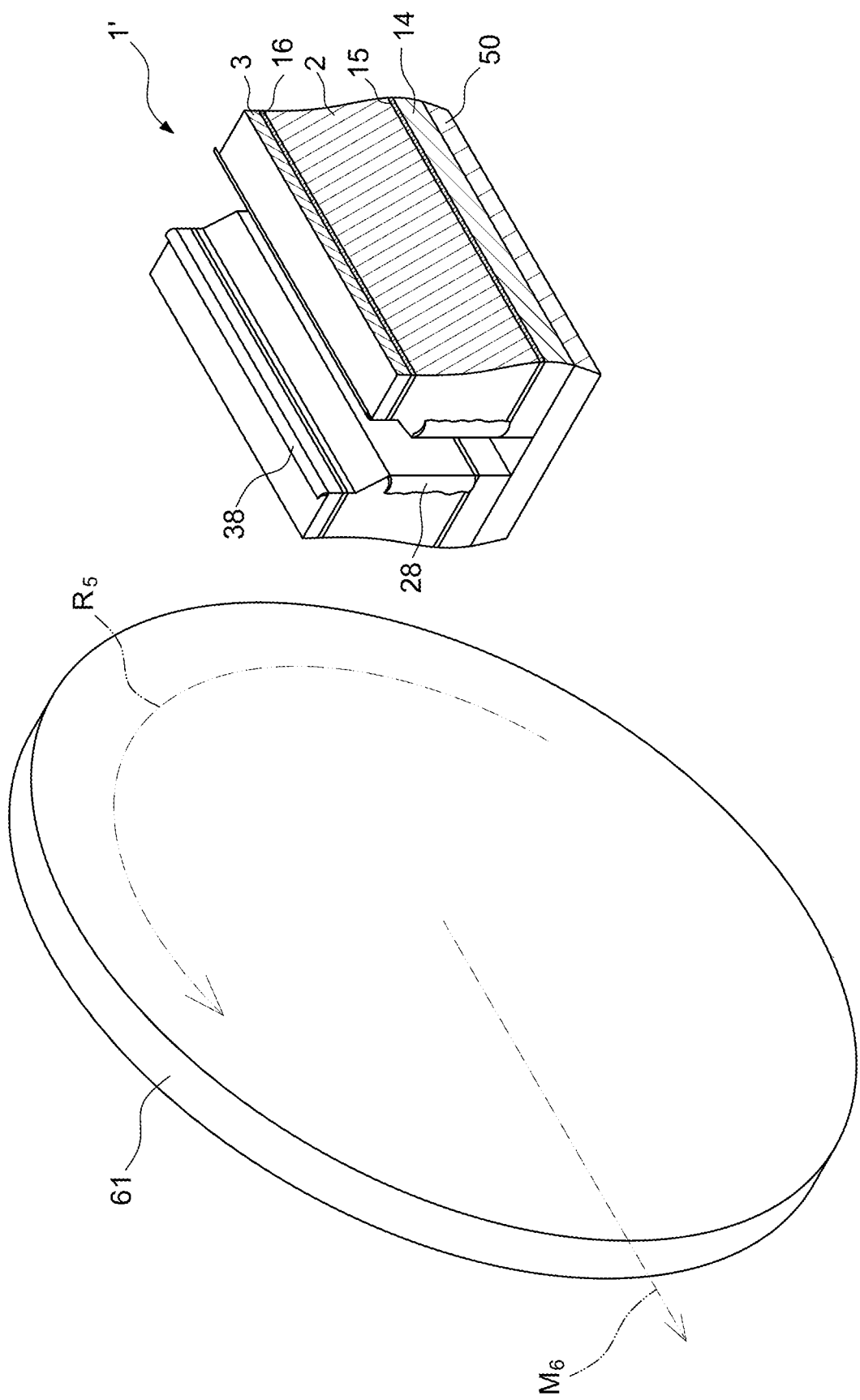
FIG. 31 illustrates one or more stages of an example of a method for manufacturing a stacked structure according to some embodiments of the present disclosure.

Referring to FIGS. 30 and 31, the standard blade 61 is then fed backward along a path of the step shown in FIGS. 27 and 28 to trim the multi-layered structure 1'. In the stage shown in FIGS. 30 and 31, the standard blade 61 may be rotating in the rotation direction $R_5$, while moving along a feed direction $M_6$. The rotation direction $R_5$ of the standard blade 61 in the stage shown in FIGS. 30 and 31 is the same as the rotation direction $R_1$ of the standard blade 61 in the step shown in FIGS. 27 and 28. The feed direction $M_6$ is opposite to the feed direction $M_5$ in the stage shown in FIGS. 27 and 28. The rotational speed and the feed speed may be the same as the step shown FIGS. 27 and 28. The standard blade 61 trims the lateral surface 23a of the polymer layer 2, so as to remove or reduce the side burrs on the polymer layer 2, such as the burr 28a.

Figure 32:
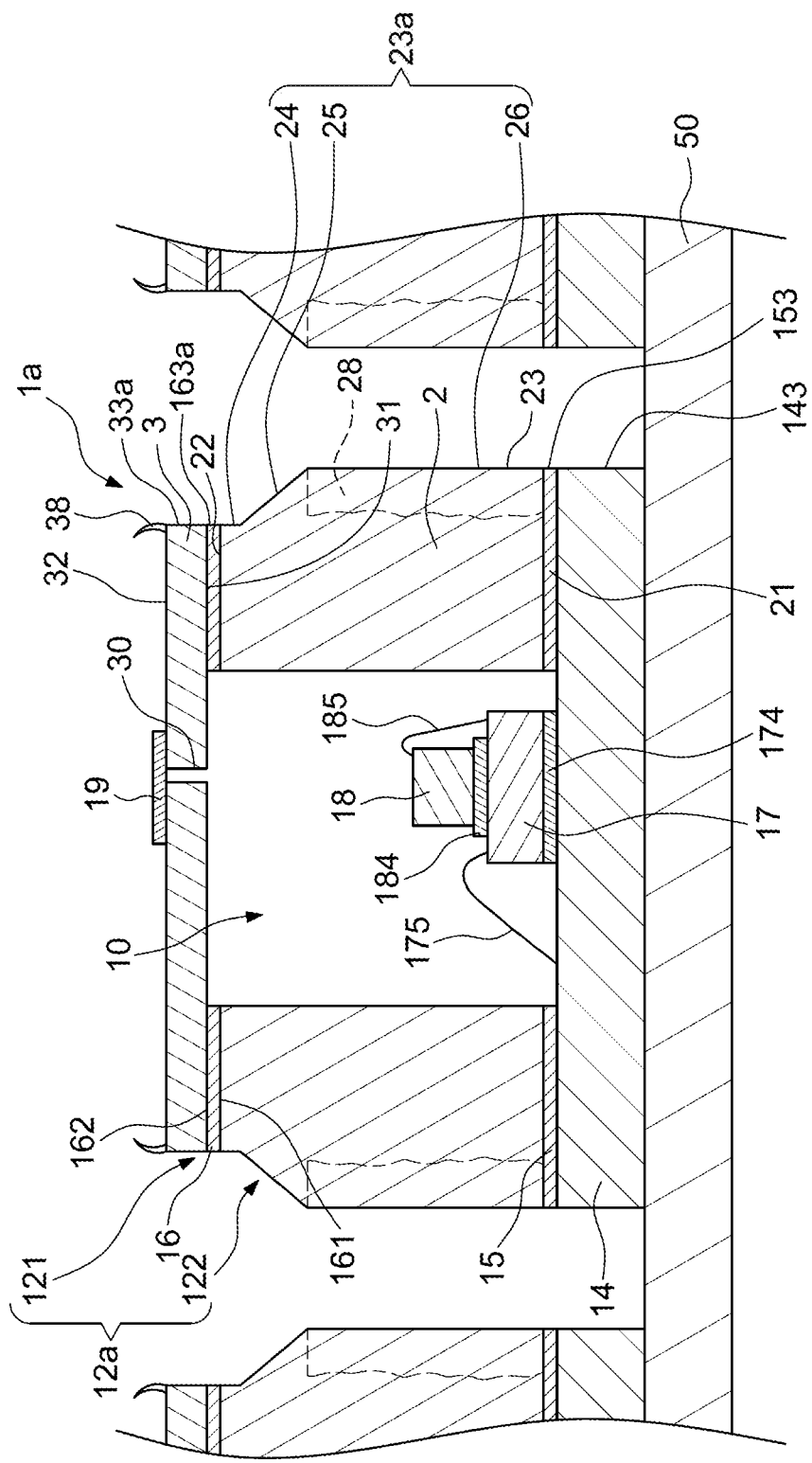
FIG. 32 illustrates one or more stages of an example of a method for manufacturing a stacked structure according to some embodiments of the present disclosure.

Referring to FIG. 32, after the trimming step shown in FIGS. 30 and 31, a stacked structure is formed, such as the stacked structure 1a shown in FIG. 2. The burr 28a is removed, while a smaller burr 28 occurs one the polymer layer 2. For example, a burr length $L_2$ of the burr 28 on the lateral surface 23a of the polymer layer 2 is about 0.8 μm to about 150 μm. The stacked structure 1a has a lateral surface. For example, the lateral surface of the stacked structure 1a may include the lateral surface 143 of the substrate 14, the lateral surface 153 of the first adhesive layer 15, the lateral surface 23a of the polymer layer 2, the lateral surface 163a of the second adhesive layer 16, and the lateral surface 33a of the metal layer 3. The lateral surface of the stacked structure 1a (e.g., the slanted portion 25 of the lateral surface 23a of the polymer layer 2) defines an indentation structure 12a. The indentation structure 12a includes a first portion 121 and a second portion 122. The first portion 121 of the indentation structure 12a corresponds to the metal layer 3, the second adhesive layer 16 and the first portion 24 of the polymer layer 2, and has a substantially consistent width. The second portion 122 of the indentation structure 12a corresponds to the slanted portion 25 of the polymer layer 2 and tapers downward.

Spatial descriptions, such as "above," "below," "up," "left," "right," "down," "top," "bottom," "vertical," "horizontal," "side," "higher," "lower," "upper," "over," "under,"

and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A stacked structure, comprising:
   a polymer layer; and
   a metal layer disposed on the polymer layer;
   wherein a burr length on a surface of the polymer layer is about 0.8 μm to about 150 μm, and a burr length on a surface of the metal layer is about 0.8 μm to about 7 μm.

2. The stacked structure of claim 1, further comprising:
   a substrate;
   a first adhesive layer disposed on the substrate, wherein the polymer layer is attached to the substrate through the first adhesive layer; and
   a second adhesive layer bonding the polymer layer and the metal layer together.

3. The stacked structure of claim 1, further comprising at least one semiconductor chip electrically connected to the substrate, wherein the first adhesive layer, the polymer layer and the second adhesive layer jointly define a cavity, and the semiconductor chip is accommodated in the cavity.

4. The stacked structure of claim 3, wherein the metal layer covers the cavity and defines a through hole communicating with the cavity.

5. The stacked structure of claim 4, further comprising an air-permeable film covering the through hole of the metal layer.

6. A stacked structure, comprising:
   a substrate;
   a polymer layer; and
   a metal layer disposed on the polymer layer disposed on the substrate;
   wherein a lateral surface of the stacked structure defines an indentation structure, and a lateral surface of the polymer layer is substantially coplanar with a lateral surface of the substrate, wherein a burr length on a surface of the polymer layer is about 0.8 μm to about 150 μm, and a burr length on a surface of the metal layer is about 0.8 μm to about 7 μm.

7. The stacked structure of claim 6, wherein a lateral surface of the metal layer is slanted toward the polymer layer to define the indentation structure.

8. The stacked structure of claim 6, wherein the indentation structure tapers downward.

9. The stacked structure of claim 6, wherein the metal layer tapers upward.

10. The stacked structure of claim 6, wherein a lateral surface of the polymer layer has a slanted portion defining the indentation structure.

11. The stacked structure of claim 10, wherein the lateral surface of the polymer layer further has a first portion and a second portion, the first portion is substantially coplanar with a lateral surface of the metal layer, and the slanted portion connects the first portion and the second portion.

12. The stacked structure of claim 6, wherein the indentation structure includes a first portion and a second portion, the first portion of the indentation structure corresponds to the metal layer and has a substantially consistent width, the second portion of the indentation structure corresponds to the polymer layer and tapers downward.

13. The stacked structure of claim 6, wherein the metal layer has a substantially consistent width, and a portion of the polymer layer tapers upward.

14. The stacked structure of claim 6, wherein the indentation structure extends into the polymer layer.

15. The stacked structure of claim 6, wherein the indentation structure includes a first portion and a second portion, the first portion of the indentation structure corresponds to the metal layer and a first portion of the polymer layer, and has a substantially consistent width, the second portion of the indentation structure corresponds to a slanted portion of the polymer layer and tapers downward.

16. The stacked structure of claim 6, wherein the metal layer is attached to the polymer layer through an adhesive layer.

17. The stacked structure of claim 6, wherein a lateral surface of the metal layer is non-parallel with a lateral surface of the polymer layer to define the indentation structure.

18. The stacked structure of claim 6, wherein the polymer layer has a lateral surface including a first portion, a slanted portion non-parallel with the first portion and a second portion substantially parallel with the first portion; the metal layer has a lateral surface substantially parallel with the first portion of the lateral surface of the polymer layer, wherein the lateral surface of the metal layer and the lateral surface of the polymer layer define the indentation structure.

* * * * *